(12) United States Patent
Takita et al.

(10) Patent No.: US 10,816,590 B2
(45) Date of Patent: Oct. 27, 2020

(54) TEST SYSTEM

(71) Applicant: SINTOKOGIO, LTD., Nagoya, Aichi (JP)

(72) Inventors: Nobuyuki Takita, Aichi (JP); Yoichi Sakamoto, Aichi (JP)

(73) Assignee: SINTOKOGIO, LTD., Nagoya-shi, Aichi (JP)

( * ) Notice: Subject to any disclaimer, the term of this patent is extended or adjusted under 35 U.S.C. 154(b) by 498 days.

(21) Appl. No.: 15/571,265

(22) PCT Filed: Aug. 29, 2016

(86) PCT No.: PCT/JP2016/003930
§ 371 (c)(1),
(2) Date: Nov. 2, 2017

(87) PCT Pub. No.: WO2017/056390
PCT Pub. Date: Apr. 6, 2017

(65) Prior Publication Data
US 2018/0348292 A1    Dec. 6, 2018

(30) Foreign Application Priority Data

Sep. 29, 2015 (JP) .................................. 2015-191900

(51) Int. Cl.
    *G01R 31/26* (2020.01)
(52) U.S. Cl.
    CPC ..... *G01R 31/2608* (2013.01); *G01R 31/2601* (2013.01)

(58) Field of Classification Search
    CPC ........................ G01R 31/2608; G01R 31/2601
    See application file for complete search history.

(56) References Cited

U.S. PATENT DOCUMENTS

| | | | |
|---|---|---|---|
| 2003/0028343 A1 | 2/2003 | Velichko et al. | |
| 2007/0001790 A1* | 1/2007 | Richmond, II | G01R 31/2851 335/2 |
| 2008/0079451 A1* | 4/2008 | Maenner | G01R 31/31905 324/756.05 |
| 2014/0247037 A1* | 9/2014 | Shinohara | G01R 1/0491 324/149 |
| 2015/0054532 A1* | 2/2015 | Yoo | G01R 31/2879 324/750.01 |
| 2016/0131709 A1* | 5/2016 | Yoo | G01R 31/2834 324/762.01 |

FOREIGN PATENT DOCUMENTS

| | | |
|---|---|---|
| CN | 1200281 A | 12/1998 |
| CN | 101865936 A | 10/2010 |

(Continued)

*Primary Examiner* — Christopher P McAndrew
*Assistant Examiner* — Zannatul Ferdous
(74) *Attorney, Agent, or Firm* — Faegre Drinker Biddle & Reath LLP

(57) ABSTRACT

A test system is a test system for conducting a test including a static characteristic test of a device under test, the test system comprising: a plurality of static characteristic units used for measurement of the static characteristic test; and a replacement unit configured to be able to attach and detach specific units among the plurality of static characteristic units, the specific units selectively used according to a measurement item.

15 Claims, 15 Drawing Sheets

(56) References Cited

FOREIGN PATENT DOCUMENTS

| | | |
|---|---|---|
| EP | 0108790 A1 | 5/1984 |
| JP | S62-063873 A | 3/1987 |
| JP | H10-185990 A | 7/1998 |
| JP | 2000-286313 A | 10/2000 |
| JP | 2001-074778 A | 3/2001 |
| JP | 2001-349927 A | 12/2001 |
| JP | 2002-006001 A | 1/2002 |
| JP | 2002-286800 A | 10/2002 |
| JP | 2006-317256 A | 11/2006 |
| JP | 2009-92562 A | 4/2009 |
| JP | 2010-175459 A | 8/2010 |
| JP | 2011-220924 A | 11/2011 |
| JP | 2012-015867 A | 1/2012 |
| JP | 2014-202728 A | 10/2014 |
| JP | 2014-209841 A | 11/2014 |
| TW | 200935075 A | 8/2009 |
| TW | 201031924 A | 9/2010 |
| TW | 201316012 A | 4/2013 |
| WO | WO 2008/068994 A1 | 6/2008 |
| WO | WO 2009/090826 A1 | 7/2009 |
| WO | WO-2010/144269 A1 | 12/2010 |
| WO | WO 2014/169186 A2 | 10/2014 |

\* cited by examiner

[Fig. 1]
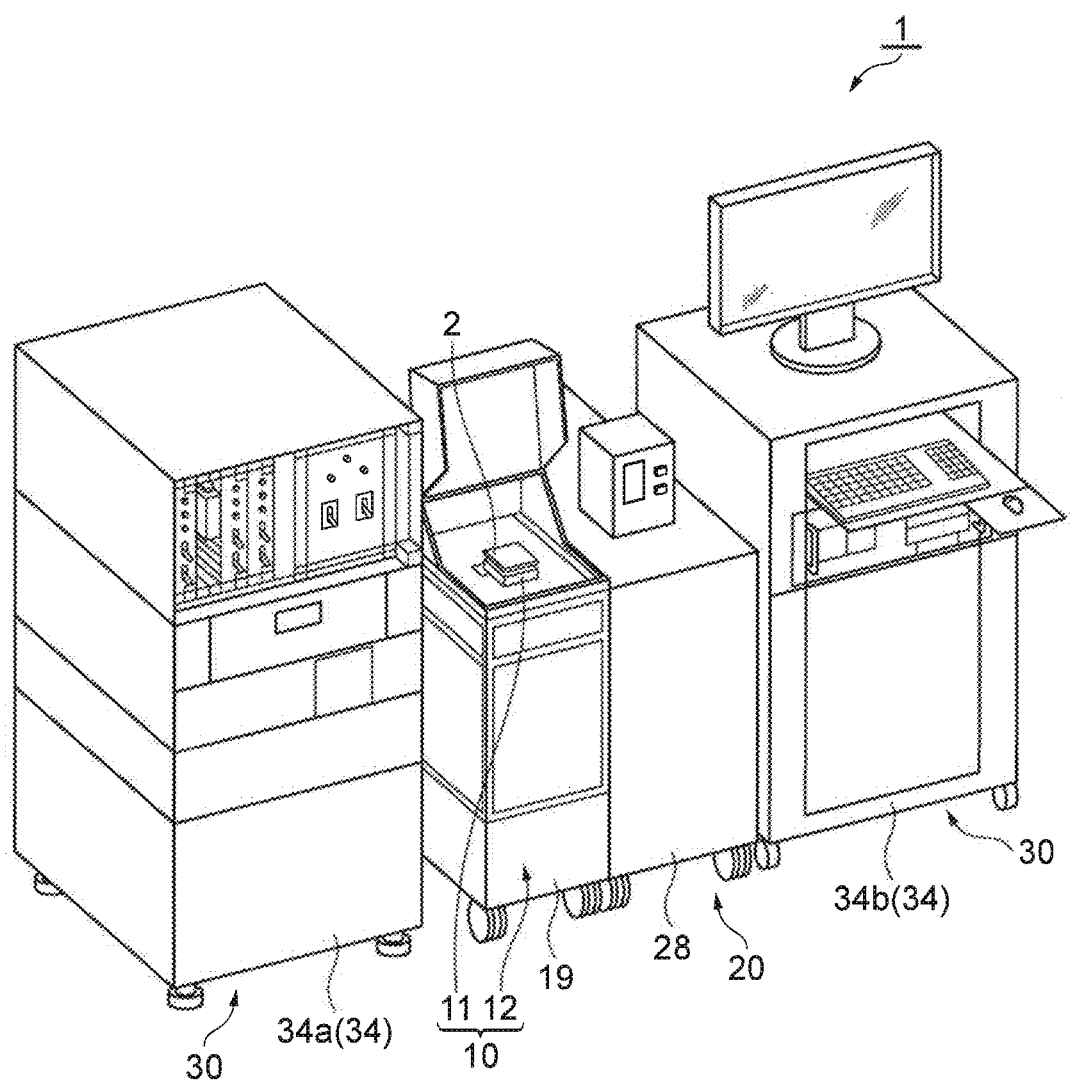

[Fig. 2]
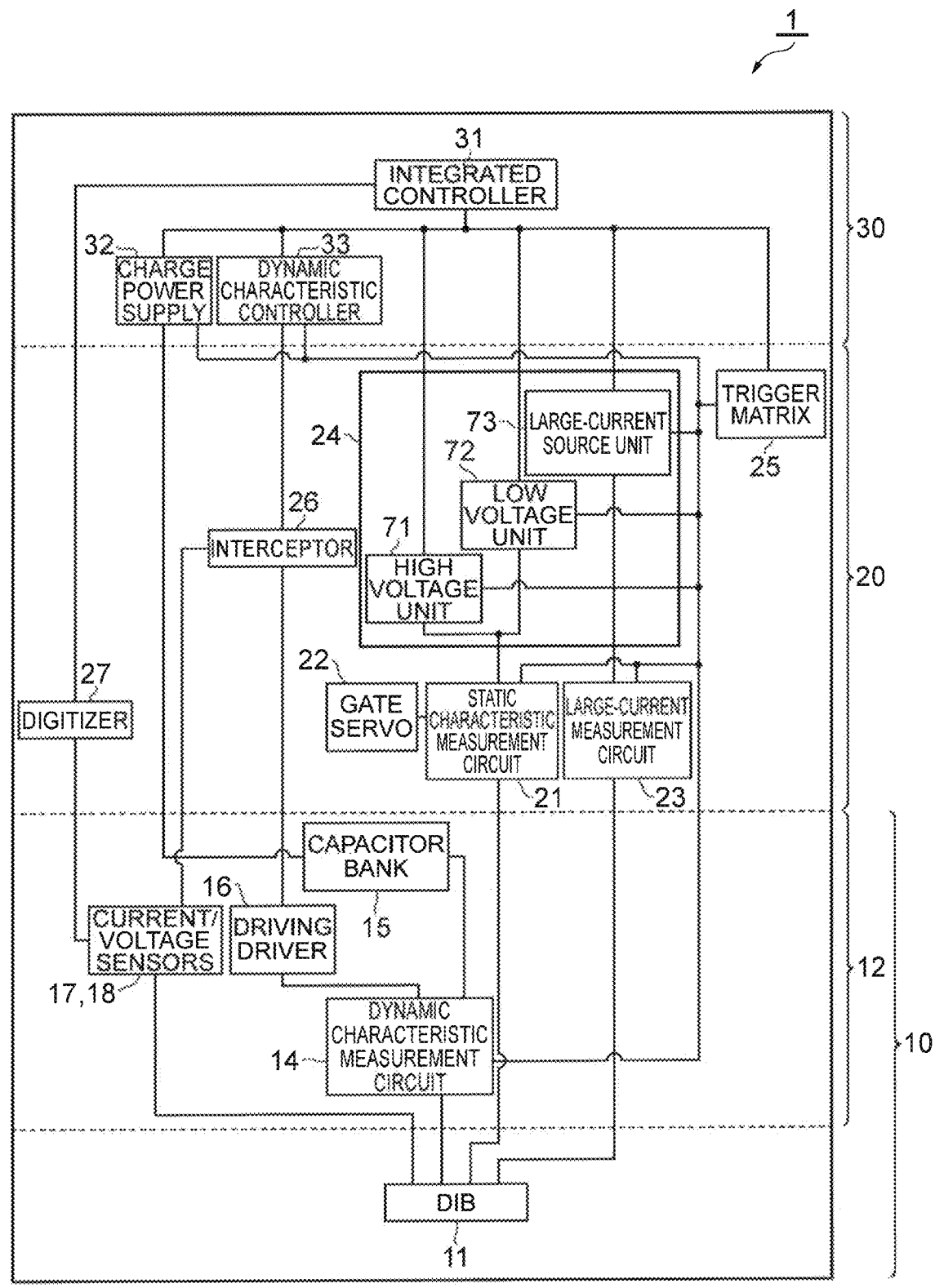

[Fig. 3]
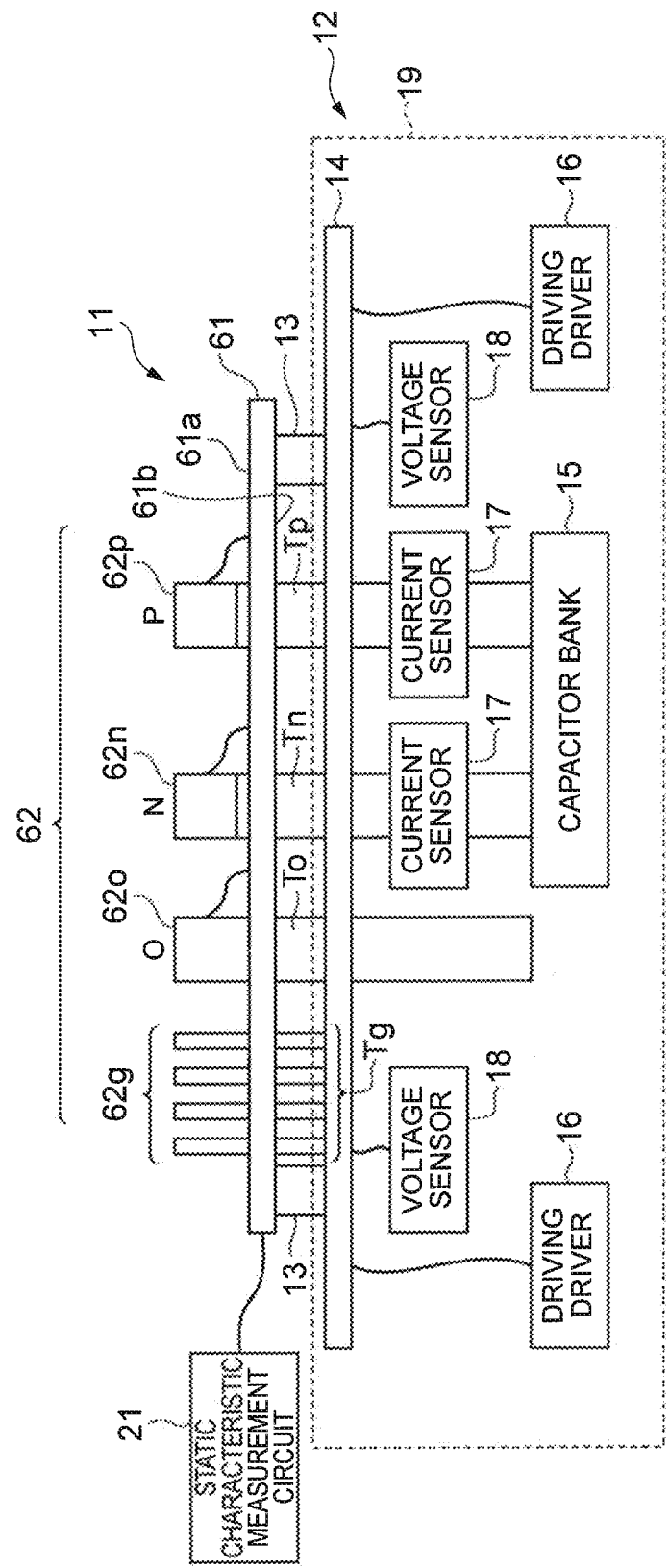

[Fig. 4]
(a)
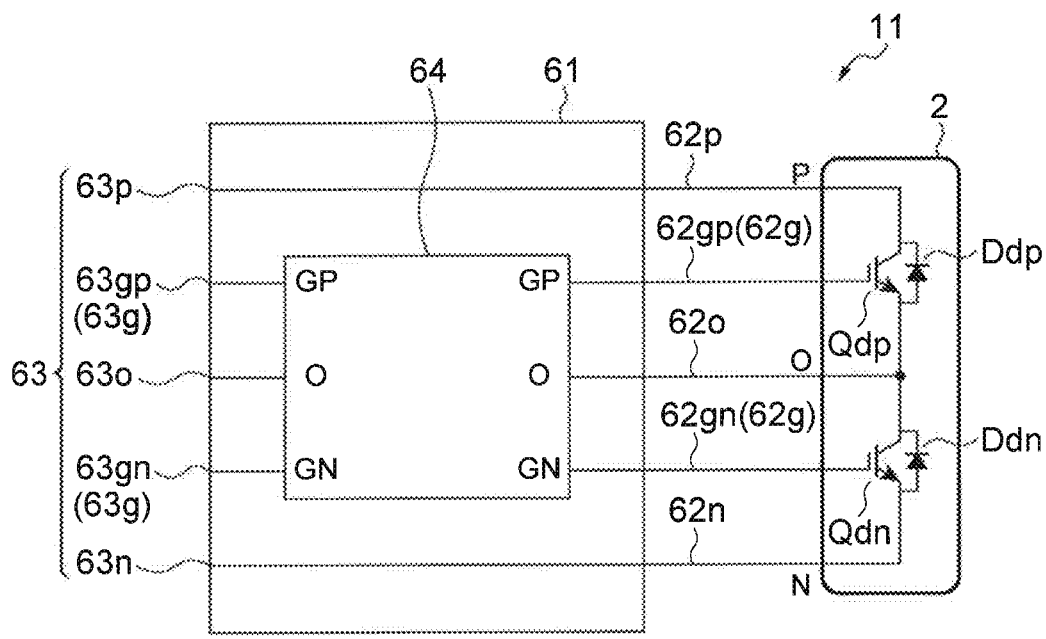
(b)
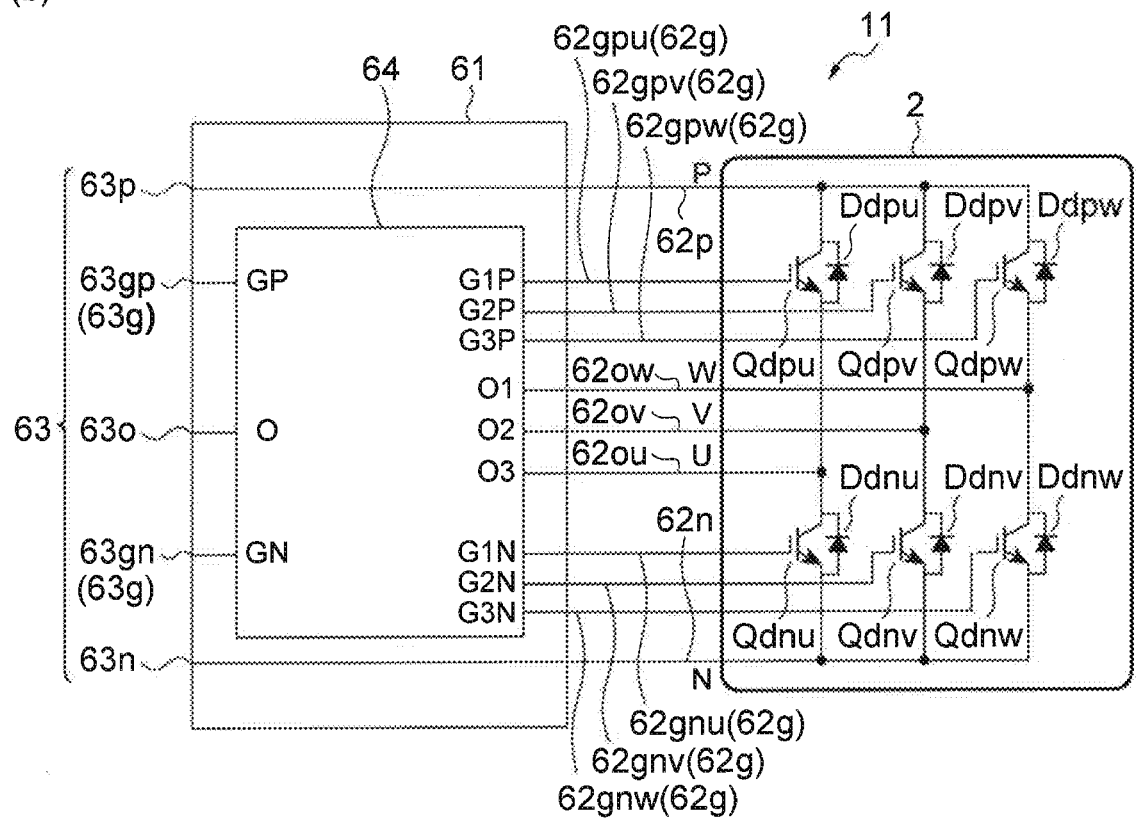

[Fig. 5]
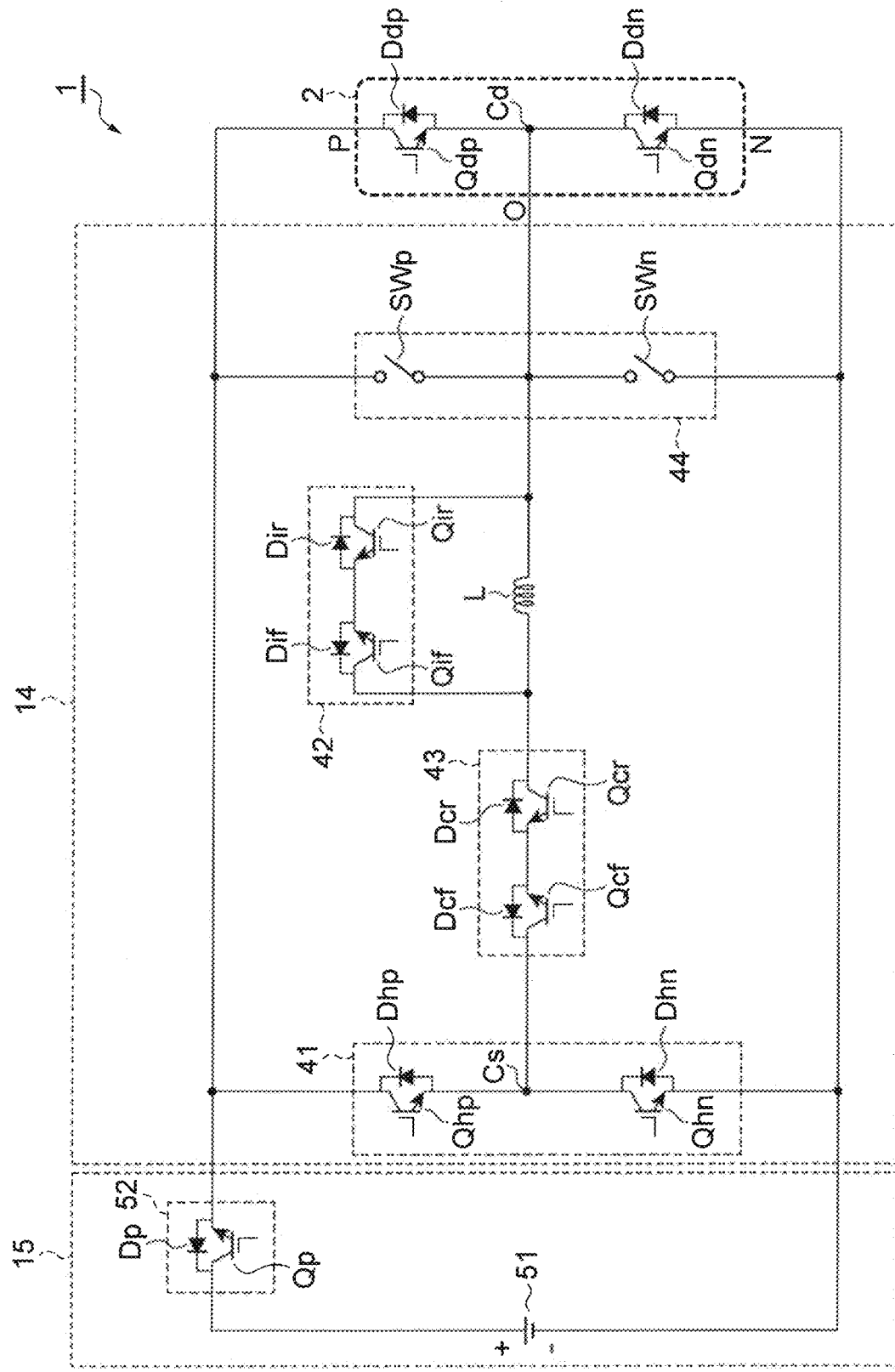

[Fig. 6]
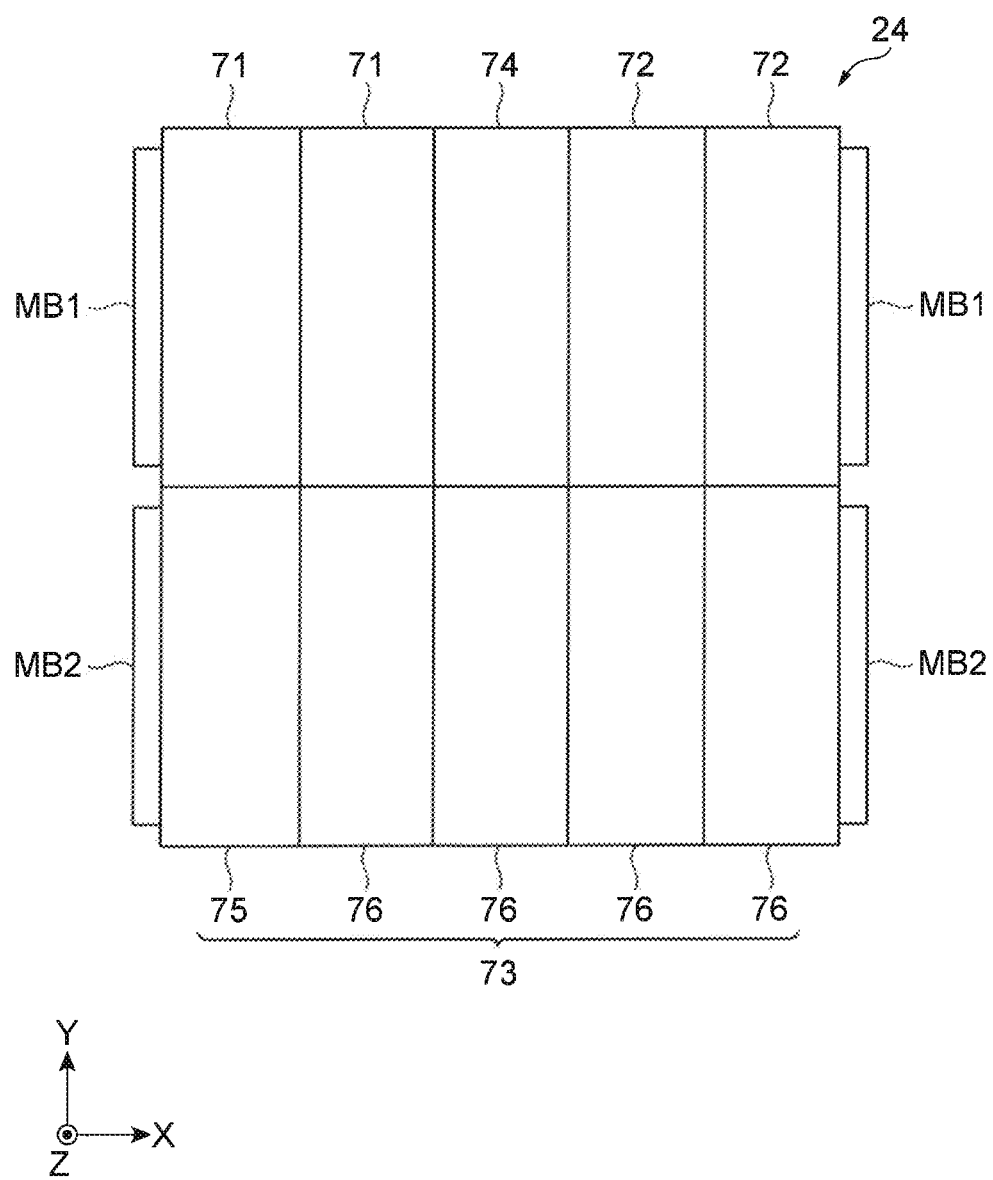

[Fig. 7]
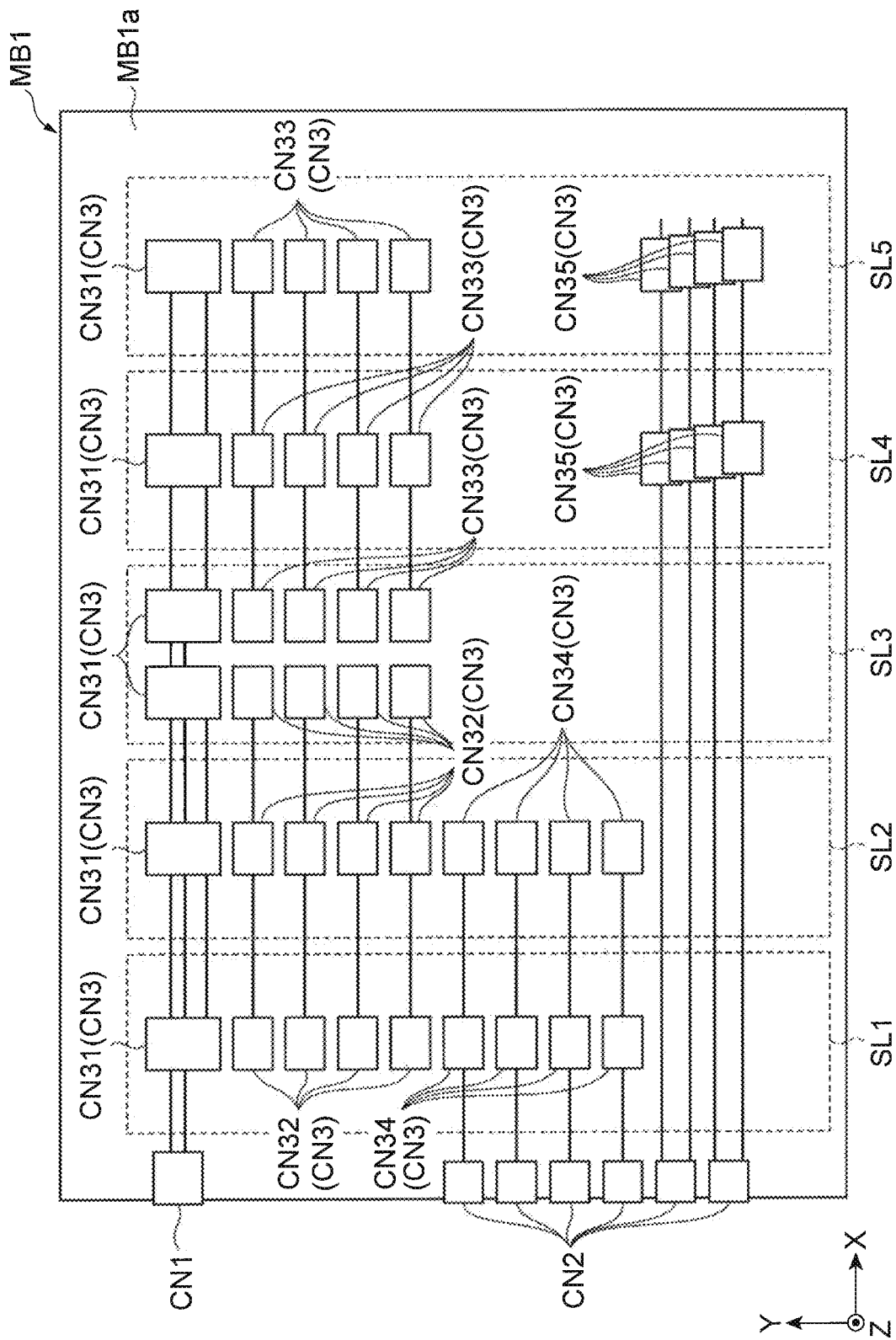

[Fig. 8]
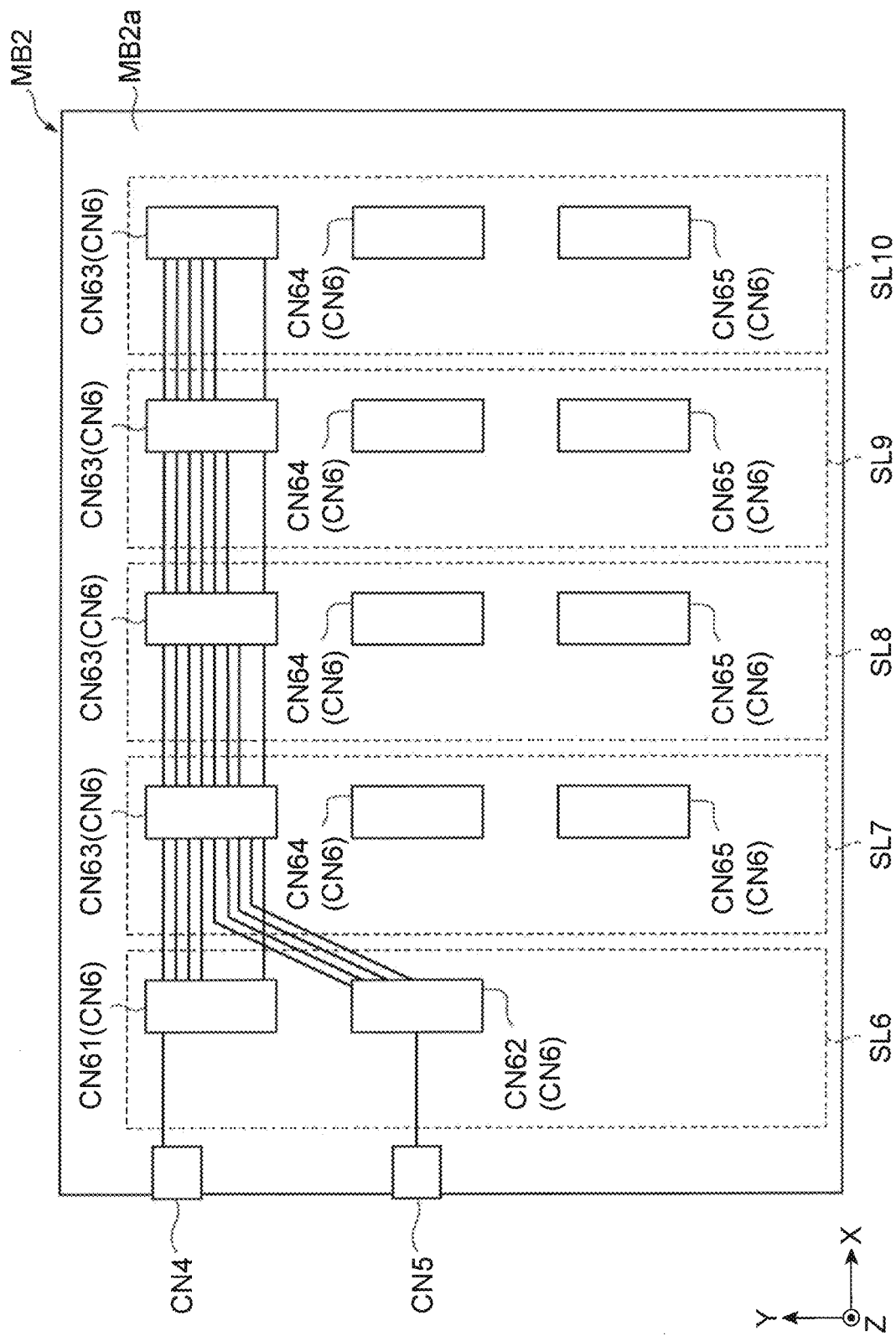

[Fig. 9]
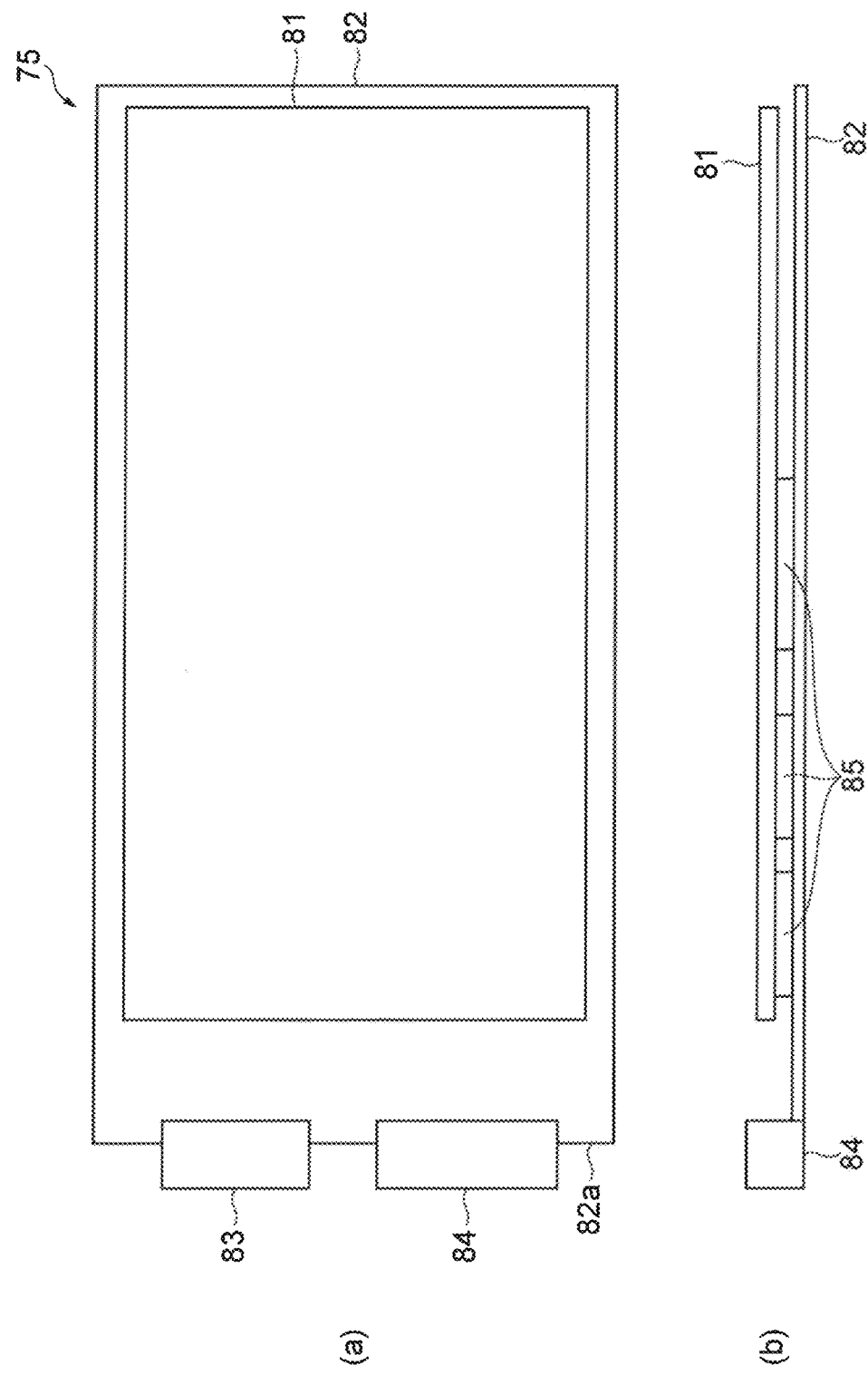

[Fig. 10]
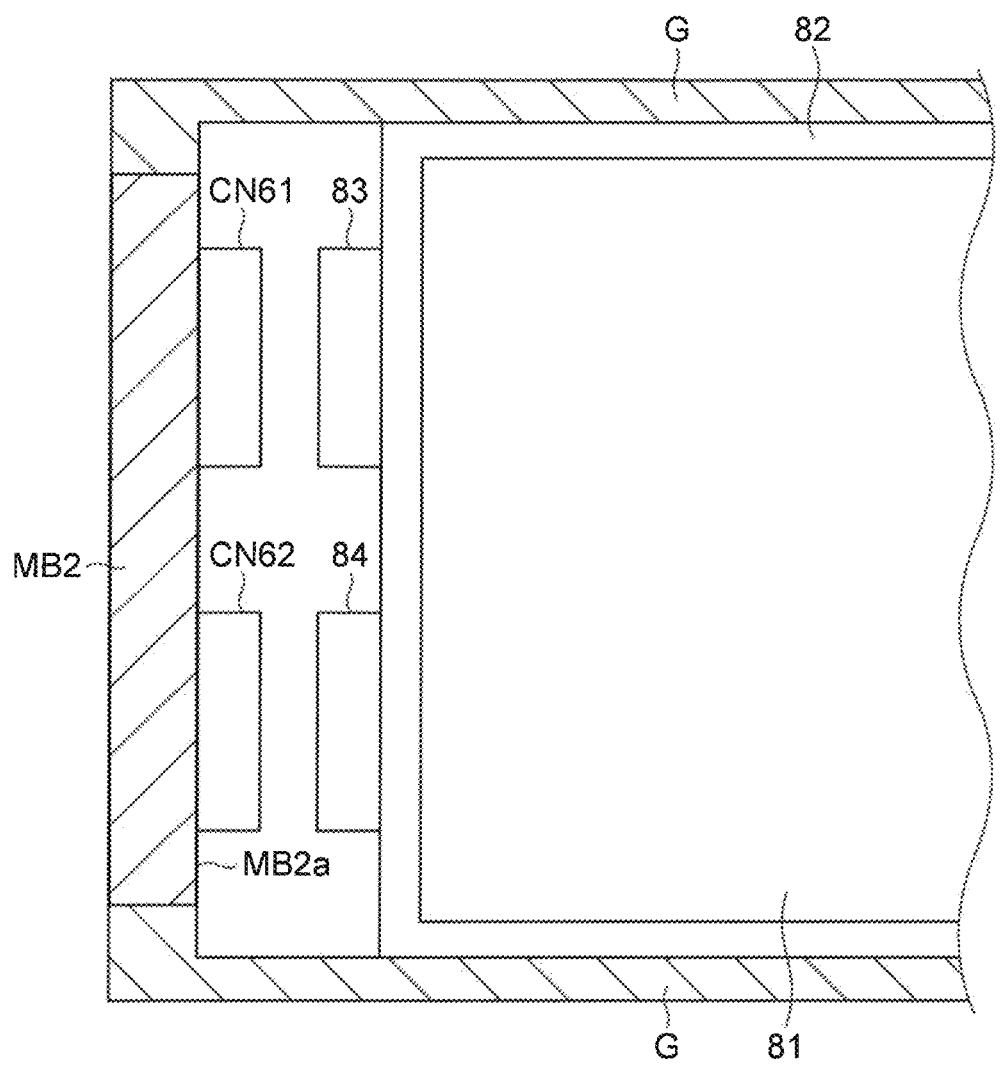

[Fig. 11]

| MEASUREMENT ITEM | STATIC CHARACTERISTIC TEST ||||| DYNAMIC CHARACTERISTIC TEST |||||||
|---|---|---|---|---|---|---|---|---|---|---|---|
| | COLLECTOR BREAKING CURRENT | GATE-EMITTER THRESHOLD VOLTAGE | GATE-EMITTER LEAKAGE CURRENT | COLLECTOR-EMITTER SATURATION VOLTAGE | ENTIRE GATE CHARGE | TURN-ON DELAY TIME | TURN-ON RISE TIME | TURN-OFF DELAY TIME | TURN-OFF FALL TIME | REVERSE RECOVERY TIME | REVERSE RECOVERY CHARGE | EMITTER-COLLECTOR VOLTAGE |
| | Ices | Vge(th) | Iges | Vce(sat) | Qg | td(on) | tr | td(off) | tf | trr | Qrr | Vec |
| HIGH VOLTAGE UNIT | ○ | | | | | | | | | | | |
| LOW VOLTAGE UNIT | | ○ | ○ | ○ | | | | | | | | |
| LARGE-CURRENT SOURCE UNIT | | ○ | ○ | ○ | | | | | | | | |
| TRIGGER MATRIX | ○ | ○ | ○ | ○ | ○ | ○ | ○ | ○ | ○ | ○ | ○ | ○ |
| GATE SERVO | | ○ | | | | | | | | | | |
| STATIC CHARACTERISTIC MEASUREMENT CIRCUIT | ○ | ○ | ○ | ○ | | | | | | | | |
| LARGE-CURRENT MEASUREMENT CIRCUIT | | | ○ | ○ | | | | | | | | |
| INTEGRATED CONTROLLER | ○ | ○ | ○ | | ○ | ○ | ○ | ○ | ○ | ○ | ○ | ○ |
| DYNAMIC CHARACTERISTIC CONTROLLER | | | | | ○ | ○ | ○ | ○ | ○ | ○ | ○ | ○ |
| INTERCEPTOR | | | | | ○ | ○ | ○ | ○ | ○ | ○ | ○ | ○ |
| DIGITIZER | | | | | ○ | ○ | ○ | ○ | ○ | ○ | ○ | ○ |
| TEST HEAD | | | | | ○ | ○ | ○ | ○ | ○ | ○ | ○ | ○ |
| CAPACITOR BANK | | | | | | ○ | ○ | ○ | ○ | ○ | ○ | ○ |
| CURRENT SENSOR | | | | | | ○ | ○ | ○ | ○ | ○ | ○ | ○ |
| VOLTAGE SENSOR | | | | | ○ | ○ | ○ | ○ | ○ | ○ | ○ | ○ |
| DYNAMIC CHARACTERISTIC MEASUREMENT CIRCUIT | | | | | ○ | ○ | ○ | ○ | ○ | ○ | ○ | ○ |
| DRIVING DRIVER | | | | | | ○ | ○ | ○ | ○ | ○ | ○ | ○ |
| CHARGE POWER SUPPLY | | | | | ○ | ○ | ○ | ○ | ○ | ○ | ○ | ○ |

[Fig. 12]
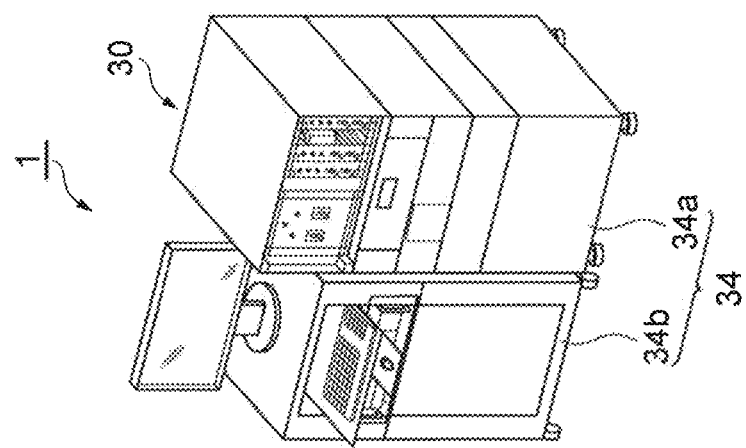
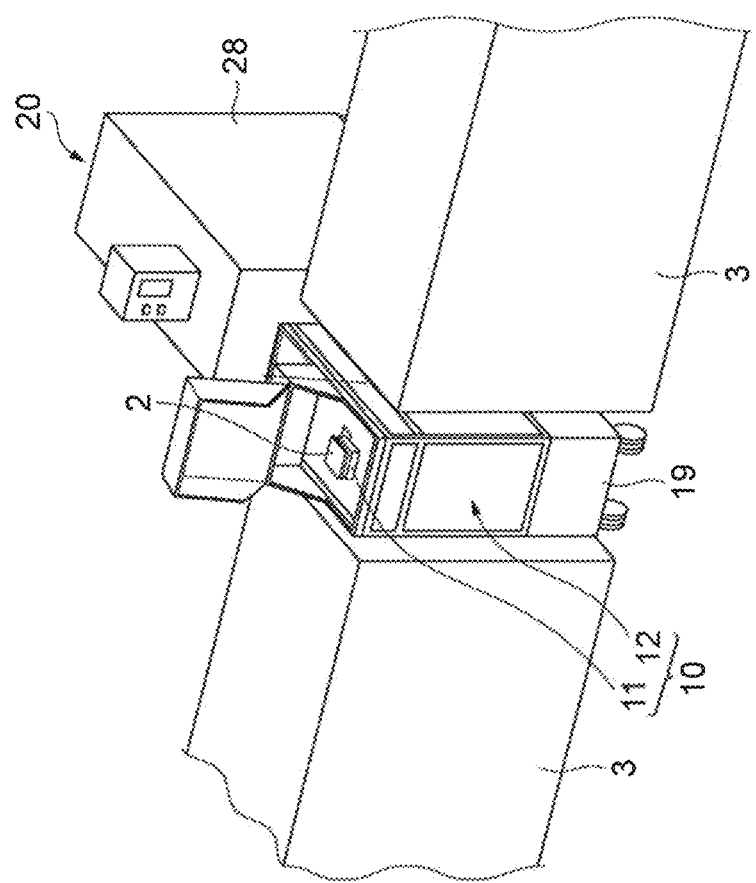

[Fig. 13]
(a)
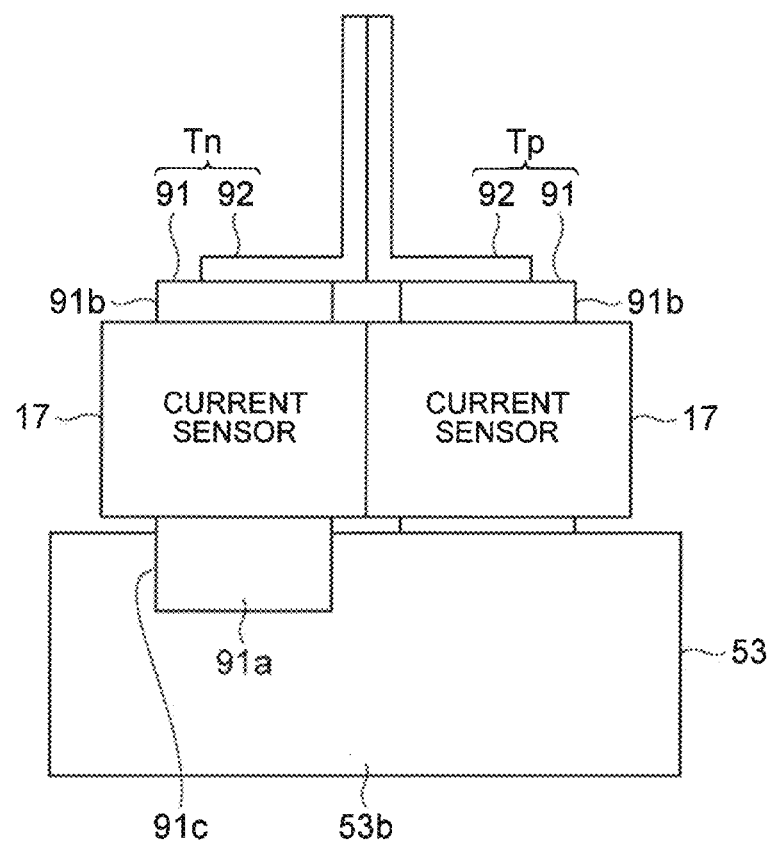
(b)
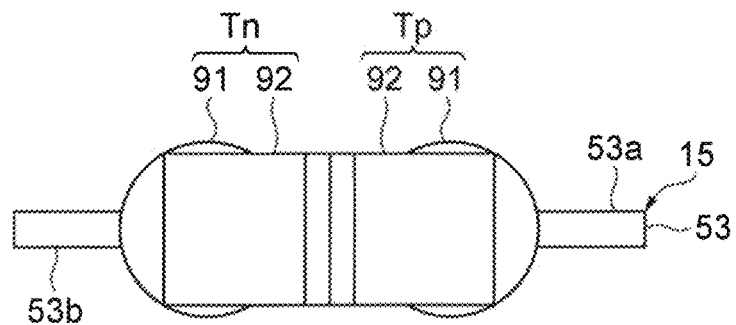

[Fig. 14]
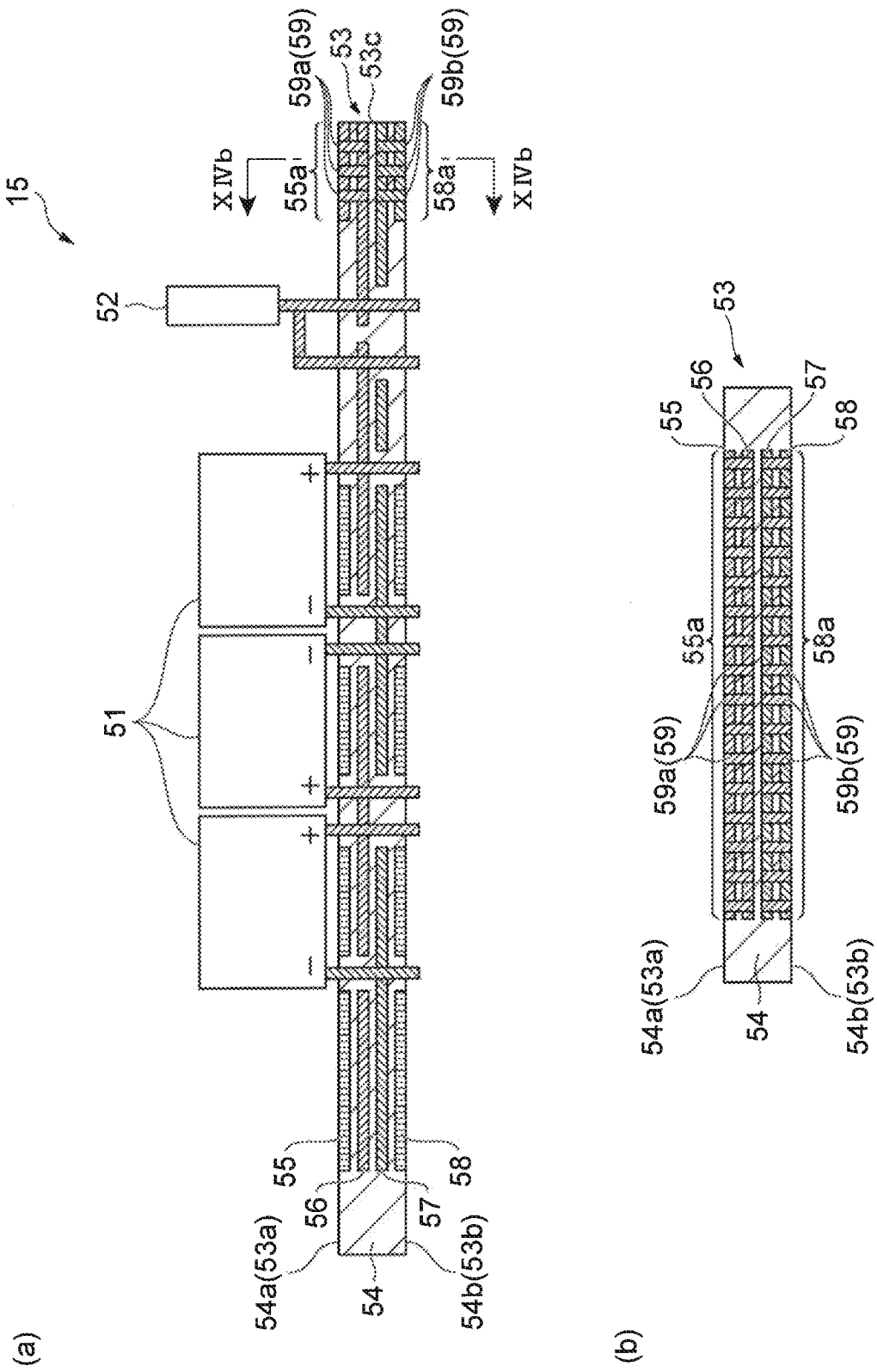

[Fig. 15]
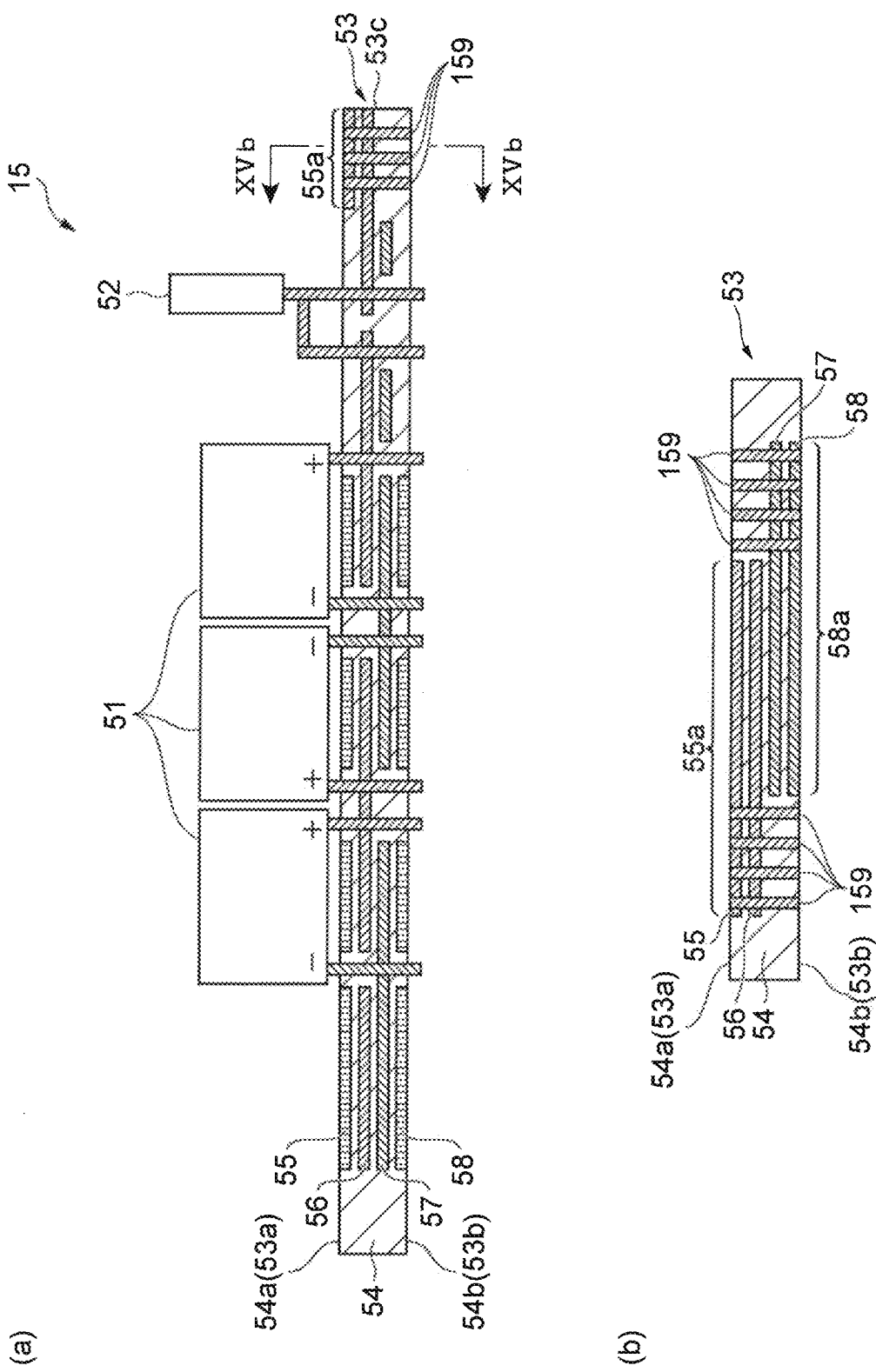

TEST SYSTEM

TECHNICAL FIELD

The present disclosure relates to a test system.

BACKGROUND ART

Conventionally, there is a test apparatus for inspecting a power semiconductor module such as an insulated gate bipolar transistor (IGBT). For example, a semiconductor test apparatus that determines quality of a device under test (DUT) is described in PTL 1.

CITATION LIST

Patent Literature

PTL 1: Japanese Unexamined Patent Publication No. 2009-92562

SUMMARY OF INVENTION

Technical Problem

Test items and test content of the DUT may vary according to requested specifications of a user. For example, there are measurement requiring supply of a voltage, measurement requiring supply of a current, and measurement requiring supply of a voltage and a current in a static characteristic test. The semiconductor test apparatus described in Patent Literature 1 cannot flexibly handle the requested specifications. More specifically, since the semiconductor test apparatus described in Patent Literature 1 needs to be separately designed to form a configuration necessary and sufficient for the test items and the test content of the DUT included in the requested specifications, the time required for providing the semiconductor test apparatus becomes long.

In the present technical field, a test system capable of flexibly handling a case in which test items requested by each user are different is desired.

Solution to Problem

A test system according to an aspect of the present disclosure is a test system for conducting a test including a static characteristic test of a device under test. The test system comprises: a plurality of static characteristic units used for measurement of the static characteristic test; and a replacement unit configured to be able to attach and detach specific units among the plurality of static characteristic units, the specific units selectively used according to a measurement item of the static characteristic test.

In the test system, the specific units selectively used according to the measurement item of the static characteristic test can be attached and detached. Therefore, for example, necessary specific units can be mounted on the replacement unit, and unnecessary specific units can be removed from the replacement unit according to a requested measurement item of the static characteristic test. As a result, even when a test item requested by each user varies, the test system does not have to be separately designed, and the test system that can handle requested specifications by simple work of just attaching and detaching the specific units can be provided.

In an embodiment, the specific units may include: a first voltage unit configured to apply a first voltage to the device under test; a second voltage unit configured to apply a second voltage smaller than the first voltage to the device under test; and a current source unit configured to supply a current to the device under test. The first voltage unit, the second voltage unit, and the current source unit may be mounted on the replacement unit according to a requested measurement item. In the static characteristic test, there are measurement requiring supply of a voltage, measurement requiring supply of a current, and measurement requiring supply of a voltage and a current. Therefore, necessary units among the first voltage unit, the second voltage unit, and the current source unit can be mounted on the replacement unit, and unnecessary specific units can be removed from the replacement unit according to the requested measurement item of the static characteristic test. As a result, even when a test item requested by each user varies, the test system does not have to be separately designed, and the test system that can handle the requested specifications by simple work of just attaching and detaching the first voltage unit, the second voltage unit, and the current source unit can be provided.

In one embodiment, the current source unit may include a plurality of current source subunits configured to supply a current of a first amount of current to the device under test. When the measurement item is a measurement item requiring the current source unit, a necessary number of current source subunits among the plurality of current source subunits may be mounted on the replacement unit according to an amount of current necessary for the measurement item. The magnitude of necessary current may vary according to the measurement item of the static characteristic test. Therefore, when the measurement item is a measurement item requiring the current source unit, the current source unit does not have to be separately designed according to the amount of current necessary for the requested measurement, and the test system that can handle the requested specifications by simple work of just mounting the necessary number of current source subunits can be provided.

In one embodiment, the test system may further comprise a plurality of dynamic characteristic units for performing a dynamic characteristic test of the device under test. In this case, the dynamic characteristic test can be performed in addition to the static characteristic test.

In one embodiment, each unit of the plurality of static characteristic units and the plurality of dynamic characteristic units may be arranged at a position closer to the device under test when a degree of influence, on a measurement accuracy of the device under test, of a signal transmitted and received by the unit is larger. In this case, because the unit that transmits and receives a signal with a large degree of influence on the measurement accuracy of the device under test is arranged close to the device under test, the length of wiring between the unit and the device under test can be short. Therefore, inductance components of the wiring for transmitting the signal with a large degree of influence on the measurement accuracy of the device under test can be suppressed, and the measurement accuracy of the device under test can be improved.

In one embodiment, the test system may further comprise a first housing, a second housing, and a third housing. The first housing, the second housing, and the third housing may be arranged in such a way that a distance from the device under test increases in order of the first housing, the second housing, and the third housing. The each unit may be housed in one of the first housing, the second housing, and the third housing according to the degree of influence. For example, when all units are housed in a housing arranged near the device under test, the housing is enlarged, and the arrangement in using the test system is limited. On the other hand, the units can be distributed and housed in the first housing, the second housing, and the third housing according to the degrees of influence, on the measurement accuracy of the device under test, of the signals transmitted and received by the units to thereby downsize the first housing arranged near the device under test while suppressing the reduction in the measurement accuracy of the device under test. As a result, a degree of freedom of arrangement in using the test system can be improved.

In one embodiment, the plurality of static characteristic units may be housed in the second housing. Because the static characteristic test is less likely to be affected by the inductance components compared to the dynamic characteristic test, the static characteristic units may be arranged at a position somewhat away from the device under test. In this way, the number of units housed in the first housing can be decreased. As a result, the first housing can be downsized without reducing the measurement accuracy.

In one embodiment, the plurality of dynamic characteristic units may comprise: a dynamic characteristic measurement circuit for performing the dynamic characteristic test; a dynamic characteristic controller configured to control the dynamic characteristic measurement circuit and the device under test according to a preset measurement pattern of the dynamic characteristic test; and an interceptor configured to control the dynamic characteristic measurement circuit and the device under test when an abnormal state is detected in the dynamic characteristic test. The interceptor may be arranged at a position closer to the device under test than the dynamic characteristic controller. In this case, the wiring between the interceptor and the device under test can be short, and the control in the abnormal state can be performed faster than the control of a normal state.

In one embodiment, the test system may further comprise an interface substrate for absorbing a physical difference according to a type of the device under test. The interface substrate may comprise probes electrically connected to electrodes of the device under test, and the number and arrangement of the probes may be set according to the type of the device under test. According to the configuration, because the interface substrate according to the type of the device under test to be tested is used, it is unnecessary to design the test system for each of different types of device under test. That is, the part of the test system except the interface substrate can be shared regardless of the type of the device under test.

In one embodiment, the device under test may be a power semiconductor module. In this case, even when a test item requested by each user varies, the test system of a power semiconductor module does not have to be separately designed, and the test system of the power semiconductor module that can handle requested specifications by simple work of just attaching and detaching the specific units can be provided.

Advantageous Effects of Invention

According to each aspect and each embodiment of the present disclosure, a power semiconductor test system capable of flexibly handling a case in which test items requested by each user are different can be provided.

BRIEF DESCRIPTION OF DRAWINGS

FIG. 1 is an external view schematically showing a power semiconductor test system according to an embodiment.

FIG. 2 is a configuration diagram schematically showing the power semiconductor test system of FIG. 1.

FIG. 3 is a diagram showing an example of configuration of a first apparatus included in the power semiconductor test system of FIG. 1.

FIG. 4 is a diagram for describing functions of a DIB included in the first apparatus of FIG. 1.

FIG. 5 is an example of a circuit diagram of a dynamic characteristic measurement circuit and a capacitor bank included in the first apparatus of FIG. 1.

FIG. 6 is a schematic configuration diagram of a replacement unit included in a second apparatus of FIG. 1.

FIG. 7 is a schematic configuration diagram of a motherboard for voltage included in the replacement unit of FIG. 6.

FIG. 8 is a schematic configuration diagram of a motherboard for current included in the replacement unit of FIG. 6.

FIG. 9 is a schematic configuration diagram of specific units that can be attached to and detached from the replacement unit of FIG. 6.

FIG. 10 is a diagram for describing connection of the motherboard of FIG. 8 and the specific units of FIG. 9.

FIG. 11 is a diagram showing units used for each measurement.

FIG. 12 is a diagram showing an example of arrangement of the power semiconductor test system of FIG. 1.

FIG. 13 is a diagram showing an example of wiring of a P output terminal and an N output terminal.

FIG. 14 is a diagram schematically showing an example of the capacitor bank included in the first apparatus of FIG. 1.

FIG. 15 is a diagram schematically showing another example of the capacitor bank included in the first apparatus of FIG. 1.

DESCRIPTION OF EMBODIMENTS

Hereinafter, embodiments of the present disclosure will be described with reference to the drawings. Note that in the description of the drawings, the same reference signs are provided to the same or equivalent elements, and overlapping description will be omitted.

FIG. 1 is an external view schematically showing a power semiconductor test system according to an embodiment. FIG. 2 is a configuration diagram schematically showing the power semiconductor test system of FIG. 1. A power semiconductor test system 1 shown in FIGS. 1 and 2 is a test system for conducting various tests including a static characteristic (DC: Direct Current) test and a dynamic characteristic (AC: Alternating Current) test of a DUT 2. The DUT 2 is a device under test and is, for example, a power semiconductor module including a set of two semiconductor elements electrically connected in series. The DUT 2 is, for example, a power semiconductor module of a 2 in 1 type, a 4 in 1 type, a 6 in 1 type, an 8 in 1 type, or the like. An example of the semiconductor element included in the DUT 2 includes an IGBT. The DUT 2 includes a P terminal, an N terminal, an O terminal, and a control terminal (electrode).

In the static characteristic test, characteristics, such as a collector breaking current Ices, a gate-emitter threshold voltage Vge (th), a gate-emitter leakage current Iges, and a collector-emitter saturation voltage Vce (sat), can be measured. In the dynamic characteristic test, switching measurement, short circuit capability measurement (SC measurement), and the like are performed. Specifically, characteristics, such as an entire gate charge Qg, a turn-on delay time td (on), a turn-on rise time tr, a turn-off delay time td (off), a turn-off fall time tf, a reverse recovery time trr, a reverse recovery charge Qrr, and an emitter-collector voltage Vec, can be measured. These measurement items are appropriately selected according to requested specifications of a user.

The power semiconductor test system 1 includes a plurality of static characteristic units used for the measurement in the static characteristic test and a plurality of dynamic characteristic units used for the measurement in the dynamic characteristic test. The plurality of static characteristic units include a static characteristic measurement circuit 21, a gate servo 22, a large-current measurement circuit 23, a trigger matrix 25, high voltage units 71, low voltage units 72, and a large-current source unit 73 described later. The plurality of dynamic characteristic units include a dynamic characteristic measurement circuit 14, a capacitor bank 15, a driving driver 16, current sensors 17, voltage sensors 18, an interceptor 26, a digitizer 27, a charge power supply 32, and a dynamic characteristic controller 33 described later.

Each unit of the plurality of static characteristic units and the plurality of dynamic characteristic units is arranged according to a degree of influence, on measurement accuracy of the DUT 2, of a signal transmitted and received by the unit. Each unit is, for example, arranged at a position farther from the DUT 2 when the degree of influence, on the measurement accuracy of the DUT 2, of the signal transmitted and received by the unit is smaller and is arranged at a position closer to the DUT 2 when the degree of influence, on the measurement accuracy of the DUT 2, of the signal transmitted and received by the unit is larger. The power semiconductor test system 1 includes a first apparatus 10, a second apparatus 20, and a third apparatus 30. In the power semiconductor test system 1, the units shown in FIG. 2 are distributed to the first apparatus 10, the second apparatus 20, and the third apparatus 30 according to a management level. The first apparatus 10, the second apparatus 20, and the third apparatus 30 are arranged in such a way that the distance from the DUT 2 increases in order of the first apparatus 10, the second apparatus 20, and the third apparatus 30. Units of a management level Lv1 are arranged in the first apparatus 10. Units of a management level Lv2 are arranged in the second apparatus 20. Units of a management level Lv3 are arranged in the third apparatus 30.

The management level is a standard indicating the accuracy required for the signal transmitted and received by each unit and is set according to the degree of influence of the signal on the measurement accuracy of the DUT 2. The management level Lv1 is an inductance management level. Specifically, high speed and high accuracy are required for the signals transmitted and received by the units of the management level Lv1. The management level Lv2 is a noise management level. Specifically, the accuracy required for the signals transmitted and received by the units of the management level Lv2 is lower than the accuracy required for the signals transmitted and received by the units of the management level Lv1 and is higher than the accuracy required for the signals transmitted and received by the units of the management level Lv3. An example of the signals transmitted and received by the units of the management level Lv2 includes a small analog signal. The management level Lv3 is a normal management level. Specifically, the accuracy required for the signals transmitted and received by the units of the management level Lv3 is lower than the accuracy required for the signals transmitted and received by the units of the management level Lv1 and the management level Lv2, and accuracy in a degree not causing a communication error is required. Examples of the signals transmitted and received by the units of the management level Lv3 include a digital signal and a signal not requiring accuracy. Therefore, the required accuracy increases in order of the management level Lv3, the management level Lv2, and the management level Lv1.

The first apparatus 10 will be described in detail with reference to FIGS. 3 to 5 in addition to FIGS. 1 and 2. FIG. 3 is a diagram showing an example of configuration of the first apparatus 10. FIG. 4 is a diagram for describing functions of a DIB included in the first apparatus 10, wherein (a) of FIG. 4 is a diagram for describing a function of the DIB when the DUT 2 is a power semiconductor module of the 2 in 1 type, and (b) of FIG. 4 is a diagram for describing a function of the DIB when the DUT 2 is a power semiconductor module of the 6 in 1 type. FIG. 5 is an example of a circuit diagram of a dynamic characteristic measurement circuit and a capacitor bank included in the first apparatus 10. As shown in FIGS. 1 to 3, the first apparatus 10 includes a DIB (Device Interface board) 11 (interface substrate) and a test head 12.

The DIB 11 is a unit for absorbing a physical difference according to the type of the DUT 2. The DIB 11 provides an interface between the DUT 2 and the test head 12. The DM 11 is prepared for each type of the DUT 2. The DIB 11 is disposed on the test head 12 through support members 13. The DIB 11 includes a substrate 61, probes 62, and contact portions 63. The number and arrangement of the probes 62 are set according to the type of the DUT 2. In this example, the probes 62 are electrically connected to the P terminal, the N terminal, the O terminal, and the control terminal of the DUT 2. The contact portions 63 are electrically connected to terminals of the test head 12. The contact portions 63 are the same regardless of the type of the DUT 2. Note that although the power semiconductor module is described as the DUT 2 here, the power semiconductor test system 1 can be a test system for a semiconductor element when the DIB 11 and the dynamic characteristic measurement circuit 14 of FIG. 2 correspond to a single semiconductor element. In other words, the power semiconductor test system 1 can also be applied to a test system configured to conduct tests (static characteristic and dynamic characteristic tests) of the semiconductor element.

In FIG. 3 and (a) of FIG. 4, the DIB 11 when the DUT 2 is a power semiconductor module of the 2 in 1 type is illustrated. In this case, the DUT 2 includes transistors Qdp and Qdn and diodes Ddp and Ddn. The transistors Qdp and Qdn are IGBTs. An emitter of the transistor Qdp and a collector of the transistor Qdn are electrically connected to each other. Cathodes of the diodes Ddp and Ddn are electrically connected to collectors of the transistors Qdp and Qdn, respectively, and anodes of the diodes Ddp and Ddn are electrically connected to emitters of the transistors Qdp and Qdn, respectively. That is, the transistors Qdp and Qdn are electrically connected in series in the same direction, the diode Ddp is a free wheel diode electrically connected in parallel with the transistor Qdp, and the diode Ddn is a free wheel diode electrically connected in parallel with the transistor Qdn. The DUT 2 includes the P terminal, the O terminal, and the N terminal. The P terminal is electrically connected to the collector of the transistor Qdp and the cathode of the diode Ddp, the N terminal is electrically connected to the emitter of the transistor Qdn and the anode of the diode Ddn, and the O terminal is electrically connected to the emitter of the transistor Qdp, the collector of the transistor Qdn, the anode of the diode Ddp, and the cathode of the diode Ddn. That is, the O terminal is electrically connected to a connection portion Cd (see FIG. 5) for electrically connecting the transistors Qdp and Qdn.

The probes 62 include a probe 62*p*, a probe 62*n*, a probe 62*o*, and probes 62*g*. The probes 62*g* include a probe 62*gp* and a probe 62*gn*. A leading end of the probe 62*p* is in contact with the P terminal of the DUT 2 such that the probe 62*p* is electrically connected to the P terminal of the DUT 2. A leading end of the probe 62*n* is in contact with the N terminal of the DUT 2 such that the probe 62*n* is electrically connected to the N terminal of the DUT 2. A leading end of the probe 62*o* is in contact with the O terminal of the DUT 2 such that the probe 62*o* is electrically connected to the O terminal of the DUT 2. A leading end of the probe 62*gp* is in contact with a control terminal for the transistor Qdp of the DUT 2 such that the probe 62*gp* is electrically connected to the control terminal for the transistor Qdp of the DUT 2. A leading end of the probe 62*gn* is in contact with a control terminal for the transistor Qdn of the DUT 2 such that the probe 62*gn* is electrically connected to a control terminal for the transistor Qdn of the DUT 2.

The contact portions 63 include a contact portion 63*p*, a contact portion 63*n*, a contact portion 63*o*, and contact portions 63*g*. The contact portions 63*g* include a contact portion 63*gp* and a contact portion 63*gn*. The contact portion 63*p* is in contact with a P output terminal Tp of the test head 12. The contact portion 63*n* is in contact with an N output terminal Tn of the test head 12. The contact portion 63*o* is in contact with an O output terminal To of the test head 12. The contact portions 63*g* come into contact with control output terminals Tg of the test head 12.

The substrate 61 is a plate-like member and includes a main surface 61*a* and a back surface 61*b* that is a surface on the opposite side of the main surface 61*a*. The DUT 2 is disposed on the main surface 61*a*. On the main surface 61*a*, the probes 62*p*, 62*n*, 62*o*, 62*gp*, and 62*gn* are provided to protrude in a normal axis direction of the main surface 61*a*. The probes 62*p*, 62*n*, 62*o*, 62*gp*, and 62*gn* are arranged at positions coming into contact with the P terminal, the N terminal, the O terminal, the control terminal for the transistor Qdp, and the control terminal for the transistor Qdn of the DUT 2, respectively, when the DUT 2 is disposed on the main surface 61*a*. The contact portions 63*p*, 63*n*, 63*o*, and 63*g* are provided on the back surface 61*b*. The contact portions 63*p*, 63*n*, 63*o*, and 63*g* are arranged at positions coming into contact with the P output terminal Tp, the N output terminal Tn, the O output terminal To, and the control output terminals of the test head 12, respectively, when the DIB 11 is disposed at a predetermined position on the test head 12.

The substrate 61 includes a selection circuit 64 and wiring for electrically connecting terminals of semiconductor elements included in the DUT 2 to the output terminals of the test head 12. Specifically, the substrate 61 includes wiring for electrically connecting the probe 62*p* and the contact portion 63*p* and wiring for electrically connecting the probe 62*n* and the contact portion 63*n*. The selection circuit 64 is a circuit for selecting a set of semiconductor elements to be tested among the plurality of sets of semiconductor elements included in the DUT 2. Specifically, the selection circuit 64 selects O terminals and control terminals of the set of the semiconductor elements to be tested in the DUT 2. The selection circuit 64 includes, for example, a switch such as a relay.

As shown in (a) of FIG. 4, since a set of semiconductor elements does not have to be selected when the DUT 2 is a power semiconductor module of the 2 in 1 type, the selection circuit 64 electrically connects the probe 62*o* and the contact portion 63*o*, electrically connects the probe 62*gp* and the contact portion 63*gp*, and electrically connects the probe 62*gn* and the contact portion 63*gn*.

In (b) of FIG. 4, the DIB 11 when the DUT 2 is a power semiconductor module of the 6 in 1 type is illustrated. In this case, the DUT 2 includes sets of the transistors Qdp and Qdn and the diodes Ddp and Ddn of the 2 in 1 type, in parallel for three phases (U, V, and W phases). More specifically, the DUT2 includes transistors Qdpu and Qdnu and diodes Ddpu and Ddnu for the U phase, includes transistors Qdpv and Qdnv and diodes Ddpv and Ddnv for the V phase, and includes transistors Qdpw and Qdnw and diodes Ddpw and Ddnw for the W phase. The DUT2 includes a P terminal, a U terminal, a V terminal, a W terminal, and an N terminal. The P terminal is electrically connected to collectors of the transistors Qdpu, Qdpv, and Qdpw, and the N terminal is electrically connected to emitters of the transistors Qdnu, Qdnv, and Qdnw. The U terminal is electrically connected to an emitter of the transistor Qdpu and a collector of the transistor Qdnu, the V terminal is electrically connected to an emitter of the transistor Qdpv and a collector of the transistor Qdnv, and the W terminal is electrically connected to an emitter of the transistor Qdpw and a collector of the transistor Qdnw.

In the DIB 11 for the power semiconductor module of the 6 in 1 type, the arrangement and the number of probes 62 are different, as compared to the DIB 11 for the power semiconductor module of the 2 in 1 type. Specifically, it is different that the probes 62*o* include a probe 62*ou*, a probe 62*ov*, and a probe 62*ow* and that the probes 62*g* include a probe 62*gpu*, a probe 62*gnu*, a probe 62*gpv*, a probe 62*gnv*, a probe 62*gpw*, and a probe 62*gnw*.

A leading end of the probe 62*ou* is in contact with the U terminal of the DUT 2 such that the probe 62*ou* is electrically connected to the U terminal of the DUT 2. A leading end of the probe 62*ov* is in contact with the V terminal of the DUT 2 such that the probe 62*ov* is electrically connected to the V terminal of the DUT 2. A leading end of the probe 62*ow* is in contact with the W terminal of the DUT 2 such that the probe 62*ow* is electrically connected to the W terminal of the DUT 2. A leading end of the probe 62*gpu* is in contact with a control terminal for the transistor Qdpu of the DUT 2 such that the probe 62*gpu* is electrically connected to the control terminal for the transistor Qdpu of the DUT 2. A leading end of the probe 62*gnu* is in contact with a control terminal for the transistor Qdnu of the DUT 2 such that the probe 62*gnu* is electrically connected to the control terminal for the transistor Qdnu of the DUT 2. A leading end of the probe 62*gpv* is in contact with a control terminal for the transistor Qdpv of the DUT 2 such that the probe 62*gpv* is electrically connected to the control terminal for the transistor Qdpv of the DUT 2. A leading end of the probe 62*gnv* is in contact with a control terminal for the transistor Qdnv of the DUT 2 such that the probe 62*gnv* is electrically connected to the control terminal for the transistor Qdnv of the DUT 2. A leading end of the probe 62*gpw* is in contact with a control terminal for the transistor Qdpw of the DUT 2 such that the probe 62*gpw* is electrically connected to the control terminal for the transistor Qdpw of the DUT 2. A leading end of the probe 62*gnw* is in contact with a control terminal for the transistor Qdnw of the DUT 2 such that the probe 62*gnw* is electrically connected to the control terminal for the transistor Qdnw of the DUT 2.

The probes 62*ou*, 62*ov*, 62*ow*, 62*gpu*, 62*gnu*, 62*gpv*, 62*gnv*, 62*gpw*, and 62*gnw* are arranged at positions coming into contact with the U terminal, the V terminal, the W terminal, the control terminal for the transistor Qdpu, the control terminal for the transistor Qdnu, the control terminal for the transistor Qdpv, the control terminal for the transistor Qdnv, the control terminal for the transistor Qdpw, and the control terminal for the transistor Qdnw of the DUT 2, respectively, when the DUT 2 is disposed on the main surface 61a.

When the DUT 2 is a power semiconductor module of the 6 in 1 type, one set of semiconductor elements needs to be selected from the three sets of semiconductor elements. Therefore, the selection circuit 64 electrically connects one of the probes 62ou, 62ov, and 62ow and the contact portion 63o, electrically connects one of the probes 62gpu, 62gpv, and 62gpw and the contact portion 63gp, and electrically connects one of the probes 62gnu, 62gnv, and 62gnw and the contact portion 63gn. Specifically, when the selection circuit 64 selects the U phase, the selection circuit 64 electrically connects the probe 62ou and the contact portion 63o, electrically connects the probe 62gpu and the contact portion 63gp, and electrically connects the probe 62gnu and the contact portion 63gn. When the selection circuit 64 selects the V phase, the selection circuit 64 electrically connects the probe 62ov and the contact portion 63o, electrically connects the probe 62gpv and the contact portion 63gp, and electrically connects the probe 62gnv and the contact portion 63gn, When the selection circuit 64 selects the W phase, the selection circuit 64 electrically connects the probe 62ow and the contact portion 63o, electrically connects the probe 62gpw and the contact portion 63gp, and electrically connects the probe 62gnw and the contact portion 63gn.

As described above, changing the number and the arrangement of the probes 62 according to the type of the DUT 2 in the DIB 11 makes it unnecessary to change parts except the DIB 11 of the power semiconductor test system 1. That is, since the DIB 11 absorbs the difference in the physical shape of the DUT 2 depending on the type of the DUT 2, the test head 12, the second apparatus 20, and the third apparatus 30 basically have common configurations regardless of the type of the DUT 2. In the following description, the power semiconductor module of the 2 in 1 type will be used as the DUT 2.

Although not illustrated in the description above, the probes 62 include a probe 62p, a probe 62n, and a probe 62o for the dynamic characteristic test and a probe 62p, a probe 62n, and a probe 62o for the static characteristic test, and the probes come into contact with the terminals of the DUT 2, respectively. Furthermore, the DIB 11 includes a separation circuit not shown. The separation circuit is a circuit for electrically separating the probe 62p, the probe 62n, and the probe 62o for the static characteristic test and the static characteristic measurement circuit 21. When the measurement of the static characteristic test is to be performed, the separation circuit electrically connects the probe 62p, the probe 62n, and the probe 62o for the static characteristic test and the static characteristic measurement circuit 21, and when the measurement of the dynamic characteristic test is to be performed, the separation circuit electrically separates the probe 62p, the probe 62n, and the probe 62o for the static characteristic test and the static characteristic measurement circuit 21. Note that the probes 62g are commonly used in the dynamic characteristic test and the static characteristic test.

The test head 12 includes the dynamic characteristic measurement circuit 14, the capacitor bank 15, the driving driver 16, the current sensors 17, the voltage sensors 18, and a housing 19 (first housing). In the test head 12, the dynamic characteristic measurement circuit 14, the capacitor bank 15, the driving driver 16, the current sensors 17, and the voltage sensors 18 are housed in the housing 19. The housing 19 is box-shaped and the P output terminal Tp, the N output terminal Tn, the O output terminal To, and the control output terminal Tg are provided so as to protrude upward from an upper surface of the housing 19.

The dynamic characteristic measurement circuit 14 is a circuit for performing the dynamic characteristic test of the DUT 2. The capacitor bank 15 is a power supply configured to supply a current for the dynamic characteristic test to the dynamic characteristic measurement circuit 14. FIG. 5 shows the dynamic characteristic measurement circuit 14 and the capacitor bank. 15 when the DUT 2 is a power semiconductor module of the 2 in 1 type. As shown in FIG. 5, the dynamic characteristic measurement circuit 14 includes a selection circuit 41, an overcurrent preventing circuit 42, a high-speed breaking circuit 43, a selection circuit 44, and a reactor L. The capacitor bank 15 includes a capacitor 51 and a main switch portion 52.

A film capacitor with excellent frequency characteristics is used as the capacitor 51, for example. When stored energy (charge) decreases, the capacitor 51 is connected to the charge power supply 32 and charged by the charge power supply 32.

The main switch portion 52 is a circuit configured to switch supply and block of current from the capacitor 51 to the DUT 2 (the transistor Qdp or the transistor Qdn). The main switch portion 52 includes a transistor Qp and a diode Dp. The transistor Qp is an IGBT. A cathode of the diode Dp is electrically connected to a collector of the transistor Qp, and an anode of the diode Dp is electrically connected to an emitter of the transistor Qp. Therefore, the diode Dp is a free wheel diode electrically connected in parallel with the transistor Qp. The collector of the transistor Qp is electrically connected to a + terminal (positive terminal) of the capacitor 51, and the emitter of the transistor Qp is electrically connected to a collector of a transistor Qhp, a cathode of a diode Dhp, one end of a switch SWp, and the P terminal of the DUT 2 described later.

The selection circuit 41 is a circuit for selecting one of the transistors Qdp and Qdn included in the DUT 2 as a target of switching measurement. The selection circuit 41 includes transistors Qhp and Qhn and diodes Dhp and Dhn. The transistors Qhp and Qhn are IGBTs. Cathodes of the diodes Dhp and Dhn are electrically connected to collectors of the transistors Qhp and Qhn, respectively, and anodes of the diodes Dhp and Dhn are electrically connected to emitters of the transistors Qhp and Qhn, respectively. Therefore, the diode Dhp is a free wheel diode electrically connected in parallel with the transistor Qhp, and the diode Dhn is a free wheel diode electrically connected in parallel with the transistor Qhn. The emitter of the transistor Qhp and the collector of the transistor Qhn are electrically connected to each other and are electrically connected to a collector of a transistor Qcf and a cathode of a diode Dcf described later. That is, the transistors Qhp and Qhn are electrically connected in series in the same direction, and a connection portion Cs electrically connecting the transistors Qhp and Qhn is electrically connected to the O terminal of the DUT 2 through the high-speed breaking circuit 43 and the reactor L. The collector of the transistor Qhp is electrically connected to the emitter of the transistor Qp, the anode of the diode Dp, the one end of the switch SWp, and the P terminal of the DUT 2. The emitter of the transistor Qhn is electrically connected to a − terminal (negative terminal) of the capacitor 51, another end of the switch SWn, and the N terminal of the DUT 2.

The overcurrent preventing circuit 42 is a circuit for consuming energy stored in the reactor L. The overcurrent preventing circuit 42 is provided electrically in parallel with the reactor L. The overcurrent preventing circuit 42 includes transistors Qif and Qir and diodes Dif and Dir. The transistors Qif and Qir are IGBTs. Cathodes of the diodes Dif and Dir are electrically connected to collectors of the transistors Qif and Qir, respectively, and anodes of the diodes Dif and Dir are electrically connected to emitters of the transistors Qif and Qir, respectively. Therefore, the diode Dif is a free wheel diode electrically connected in parallel with the transistor Qif, and the diode Dir is a free wheel diode electrically connected in parallel with the transistor Qir. The emitter of the transistor Qif and the emitter of the transistor Qir are electrically connected to each other. That is, the transistors Qif and Qir are electrically connected in series in opposite directions. The collector of the transistor Qif is electrically connected to a collector of a transistor Qcr, a cathode of a diode Dcr, and one end of the reactor L described later. The collector of the transistor Qir is electrically connected to another end of the reactor L, the other end of the switch SWp, one end of a switch SWn, and the O terminal of the DUT 2.

The high-speed breaking circuit 43 is a circuit for causing the overcurrent preventing circuit 42 to consume the energy stored in the reactor L at a high speed. The high-speed breaking circuit 43 is provided electrically in series with the reactor L. The high-speed breaking circuit 43 includes the transistors Qcf and Qcr and the diodes Dcf and Dcr. The transistors Qcf and Qcr are IGBTs. The cathodes of the diodes Dcf and Dcr are electrically connected to the collectors of the transistors Qcf and Qcr, respectively, and anodes of the diodes Dcf and Dcr are electrically connected to emitters of the transistors Qcf and Qcr, respectively. Therefore, the diode Dcf is a free wheel diode electrically connected in parallel with the transistor Qcf, and the diode Dcr is a free wheel diode electrically connected in parallel with the transistor Qcr. The emitter of the transistor Qcf and the emitter of the transistor Qcr are electrically connected to each other. That is, the transistors Qcf and Qcr are electrically connected in series in opposite directions. The collector of the transistor Qcf is electrically connected to the emitter of the transistor Qhp, the collector of the transistor Qhn, the anode of the diode Dhp, and the cathode of the diode Dhn. The collector of the transistor Qcr is electrically connected to the collector of the transistor Qif, the cathode of the diode Dif, and the one end of the reactor L.

The selection circuit 44 is a circuit for selecting one of the transistors Qdp and Qdn included in the DUT 2 as a target of short circuit capability measurement. The selection circuit 44 includes the switches SWp and SWn. The switches SWp and SWn are relays. The one end of the switch SWp is electrically connected to the emitter of the transistor Qp, the anode of the diode Dp, the collector of the transistor Qhp, the cathode of the diode Dhp, and the P terminal of the DUT 2. The other end of the switch SWp and the one end of the switch SWn are electrically connected to each other and are electrically connected to the other end of the reactor L, the collector of the transistor Qir, the cathode of the diode Dir, and the O terminal of the DUT 2. The other end of the switch SWn is electrically connected to the − terminal of the capacitor 51, the emitter of the transistor Qhn, the anode of the diode Dhn, and the N terminal of the DUT 2.

The reactor L is a load of the dynamic characteristic test. That is, the reactor L is a load of the transistors Qdp and Qdn. The one end of the reactor L is electrically connected to the collector of the transistor Qcr and the cathode of the diode Dcr, and the other end of the reactor L is electrically connected to the O terminal of the DUT 2.

The driving driver 16 switches an on-state (conductive state) and an off-state (cutoff state) of the transistors Qp, Qhp, Qhn, Qif, Qir, Qcf, Qcr, Qdp, and Qdn and the switches SWp and SWn. The driving driver 16 outputs a gate signal to each of the transistors Qp, Qhp, Qhn, Qif, Qir, Qcf, Qcr, Qdp, and Qdn according to an instruction from the interceptor 26 or the dynamic characteristic controller 33 to thereby switch the on-state and the off-state of each transistor. The driving driver 16 outputs a relay signal to each of the switches SWp and SWn according to an instruction from the interceptor 26 or the dynamic characteristic controller 33 to thereby switch the on-state and the off-state of each switch. Note that the on-state of the transistor denotes that the collector and the emitter are in an electrically conductive state, and the off-state of the transistor denotes that the collector and the emitter are in an electrically cutoff state. When the transistor is an IGBT, the on-state and the off-state are switched by a gate-emitter voltage.

The current sensors 17 are sensors configured to detect current values of currents flowing in the P terminal and the N terminal of the DUT 2. The current sensors 17 are provided on the P output terminal Tp and the N output terminal Tn. The current sensors 17 output the detected current values to the interceptor 26 and the digitizer 27. The voltage sensors 18 are sensors configured to detect voltage values of voltages of the P terminal and the N terminal of the DUT 2. The voltage sensors 18 are provided on the P output terminal Tp and the N output terminal Tn. The voltage sensors 18 output the detected voltage values to the interceptor 26 and the digitizer 27. The current sensors 17 and the voltage sensors 18 communicate with the interceptors 26 and the digitizers 27 through analog voltages.

Next, the second apparatus 20 will be described in detail with reference to FIGS. 1 and 2. The second apparatus 20 includes the static characteristic measurement circuit 21, the gate servo 22, the large-current measurement circuit 23, a replacement unit 24, the trigger matrix 25, the interceptor 26, the digitizer 27, and a housing 28 (second housing). In the second apparatus 20, the static characteristic measurement circuit 21, the gate servo 22, the large-current measurement circuit 23, the replacement unit 24, the trigger matrix 25, the interceptor 26, and the digitizer 27 are housed in the housing 28. The housing 28 is box-shaped.

The static characteristic measurement circuit 21 is a circuit for performing the static characteristic test of the DUT 2. The static characteristic measurement circuit 21 includes, for example, a relay matrix circuit and a circuit including passive elements, such as a resistance element, a capacitor, and a reactor. The relay matrix circuit is a circuit for determining how to connect each unit of the high voltage units 71 and the low voltage units 72 and each terminal of the DUT 2. The circuit including the passive elements is a circuit for clamping a gate and stabilizing static characteristic measurement.

The gate servo 22 is a unit used for measurement of a gate-emitter threshold voltage Vge (th) in the static characteristic test. The gate servo 22 includes, for example, an operational amplifier and a plurality of resistance elements. The gate servo 22 adjusts a gate voltage of the element to be measured of the transistors Qdp and Qdn of the DUT 2 to thereby perform control in such a way that a collector current of the element to be measured becomes a predetermined current. The gate servo 22 is mounted as a substrate that can be attached to and detached from the static characteristic measurement circuit 21.

The large-current measurement circuit 23 is a circuit for performing measurement that requires a large current (for example, about 800 A) in the static characteristic test. The large-current measurement circuit 23 is used for measurement of, for example, a collector-emitter saturation voltage Vce (sat) of the static characteristic test and an emitter-collector voltage Vec of the dynamic characteristic test. The large-current measurement circuit 23 has, for example, a circuit configuration similar to the static characteristic measurement circuit 21 and includes a relay matrix circuit and a circuit including passive elements, such as a resistance element, a capacitor, and a reactor. In the large-current measurement circuit 23, the relay matrix circuit is a circuit for determining how to connect the large-current source unit 73 and each terminal of the DUT 2. The large-current measurement circuit 23 includes, for example, a plurality of switches, and the large-current measurement circuit 23 switches the on-state and the off-state of the switches to thereby select one of the transistors Qdn and Qdp of the DUT 2 as a measurement target.

The replacement unit 24 is configured to be able to attach and detach specific units selectively used according to a measurement item among a plurality of static characteristic units. Examples of the specific units that can be attached and detached include the high voltage units 71 (first voltage units), the low voltage units 72 (second voltage units), and the large-current source unit 73 (current source unit). That is, the high voltage units 71, the low voltage units 72, and the large-current source unit 73 are mounted on the replacement unit 24 according to a requested measurement item. The high voltage units 71 apply a first voltage to the measurement target of the DUT 2. The first voltage is, for example, a high voltage of about 1500V. The low voltage units 72 apply a second voltage smaller than the first voltage to the measurement target of the DUT 2. The second voltage is, for example, a low voltage of about 150V. Note that the high voltage units 71 and the low voltage units 72 supply a current of about 0.1 A to the measurement target of the DUT 2. The large-current source unit 73 supplies a current to the measurement target of the DUT 2. The large-current source unit 73 supplies, for example, a current of about 500 A and a voltage of about 10V. A specific configuration of the replacement unit 24 will be described later.

The trigger matrix 25 is configured to receive a trigger emitted by a unit and control an output destination of the received trigger. The trigger matrix 25 is connected to and capable of communicating with the dynamic characteristic measurement circuit 14, the static characteristic measurement circuit 21, the large-current measurement circuit 23, the charge power supply 32, the dynamic characteristic controller 33, the high voltage units 71, the low voltage units 72, and the large-current source unit 73 through, for example, optical fibers. The trigger matrix 25 receives a trigger from these units and outputs the trigger to units of the output destination. The trigger matrix 25 determines the units of the output destination according to a matrix set in advance by an integrated controller 31 and outputs the trigger to the units of the output destination. The trigger matrix 25 distributes a synchronization pulse for synchronizing the units to all units connected to and capable of communicating with the trigger matrix 25.

When the interceptor 26 detects an abnormal state in the dynamic characteristic test, the interceptor 26 controls the dynamic characteristic measurement circuit 14, the capacitor bank 15, and the DUT 2. The interceptor 26 instructs the driving driver 16 to switch the on-state and the off-state of the transistors included in the dynamic characteristic measurement circuit 14, the capacitor bank 15, and the DUT 2. The interceptor 26 determines, for example, whether the current value detected by the current sensor 17 exceeds an overcurrent threshold, and the interceptor 26 detects an overcurrent (abnormal state) when the current value detected by the current sensor 17 exceeds the overcurrent threshold. The overcurrent threshold is a preset value for detecting the overcurrent. When the interceptor 26 detects the overcurrent, the interceptor 26 instructs the driving driver 16 to execute an overcurrent prevention process. The interceptor 26 operates the overcurrent preventing circuit 42 in the overcurrent prevention process. The overcurrent prevention process will be described later.

The digitizer 27 is used in the dynamic characteristic test, and the digitizer 27 is configured to sample the current value detected by the current sensor 17 and the voltage value detected by the voltage sensor 18 to convert the current value and the voltage value to digital values. The digitizer 27 outputs the current value and the voltage value converted to the digital values to the integrated controller 31. The digitizer 27 and the integrated controller 31 are connected by, for example, an optical fiber, and the digitizer 27 and the integrated controller 31 transmit and receive data through optical communication.

Next, the third apparatus 30 will be described in detail with reference to FIGS. 1 and 2. The third apparatus 30 includes the integrated controller 31, the charge power supply 32, the dynamic characteristic controller 33, and housings 34 (third housings). The housings 34 include a housing 34a and a housing 34b. In the third apparatus 30, the charge power supply 32 is housed in the housing 34a, and the integrated controller 31 and the dynamic characteristic controller 33 are housed in the housing 34b. The housing 34a and the housing 34b are box-shaped. The housing 34a and the housing 34b may be integrated.

The integrated controller 31 is a control apparatus for controlling the entire power semiconductor test system 1. The integrated controller 31 outputs, to each unit, a command or the like for controlling each unit. The integrated controller 31 is realized by, for example, installing a control program (software) of the power semiconductor test system 1 on a general-purpose personal computer. The integrated controller 31 is connected to and capable of communicating with each of the dynamic characteristic measurement circuit 14, the static characteristic measurement circuit 21, the trigger matrix 25, the charge power supply 32, the dynamic characteristic controller 33, the high voltage units 71, the low voltage units 72, and the large-current source unit 73 through, for example, a LAN (Local Area Network). Note that in FIG. 2, illustration of the connection between the integrated controller 31 and the dynamic characteristic measurement circuit 14 and between the integrated controller 31 and the static characteristic measurement circuit 21 is omitted. In this case, a unit definition file is set in the integrated controller 31 according to the unit connected to the LAN. The unit definition file is a file defining an IP (Internet Protocol) address, a function, a command, and the like of the unit. In this way, the integrated controller 31 recognizes the unit connected to the LAN.

The charge power supply 32 is a power supply for charging and discharging the capacitor 51 of the capacitor bank 15. The charge power supply 32 is, for example, a high voltage power supply. The charge power supply 32 charges the capacitor 51 to conduct the dynamic characteristic test. The charge power supply 32 discharges the capacitor 51 after the end of the dynamic characteristic test.

The dynamic characteristic controller 33 is configured to control the dynamic characteristic measurement circuit 14, the capacitor bank 15, and the DUT 2 according to a preset measurement pattern of the dynamic characteristic test. The dynamic characteristic controller 33 instructs the driving driver 16 to switch the on-state and the off-state of the transistors Qp, Qhp, Qhn, Qif, Qir, Qcf, Qcr, Qdp, and Qdn and the switches SWp and SWn according to the preset measurement pattern of the dynamic characteristic test. Note that the dynamic characteristic controller 33 is connected to the driving driver 16 by an optical signal through the interceptor 26.

Next, an example of the overcurrent prevention process by the interceptor 26 will be described with reference to FIG. 5. For example, the interceptor 26 instructs the driving driver 16 to operate the overcurrent preventing circuit 42 in response to detection of an overcurrent in the N output terminal Tn caused by the fact that the transistor Qdn of the DUT 2 does not enter the off-state in the switching measurement of the transistor Qdn (will be called "N-side switching measurement" in some cases). More specifically, the interceptor 26 instructs the driving driver 16 to put the transistors Qcf, Qcr, Qir, and Qdn into the on-state and put the other transistors into the off-state. In this case, a current path is formed which goes round through the transistor Qcf, the transistor Qcr, the reactor L, the transistor Qdn, and the diode Dhn in this order, and a current path is formed which goes round through the reactor L, the transistor Qir, and the diode Dif in this order. In this way, the energy stored in the reactor L when the overcurrent occurs flows in each current path. In each current path, the energy is consumed by the resistance components and the like, such as transistors and diodes, and the amount of current becomes 0. In this way, the overcurrent preventing circuit 42 consumes the energy stored in the reactor L when the overcurrent occurs, and further flow of overcurrent in the DUT 2 is prevented in the N-side switching measurement.

Similarly, the interceptor 26 instructs the driving driver 16 to operate the overcurrent preventing circuit 42 in response to detection of an overcurrent in the P output terminal Tp caused by the fact that the transistor Qdp of the DUT 2 does not enter the off-state in the switching measurement of the transistor Qdp (will be called "P-side switching measurement" in some cases). More specifically, the interceptor 26 instructs the driving driver 16 to put the transistors Qcf, Qcr, Qif, and Qdp into the on-state and put the other transistors into the off-state. In this case, a current path is formed which goes round through the reactor L, the transistor Qcr, the transistor Qcf, the diode Dhp, and the transistor Qdp in this order, and a current path is formed which goes round through the reactor L, the transistor Qif, and the diode Dir in this order. In this way, the energy stored in the reactor L when the overcurrent occurs flows in each current path. In each current path, the energy is consumed by the resistance components and the like, such as transistors and diodes, and the amount of current becomes 0. In this way, the overcurrent preventing circuit 42 consumes the energy stored in the reactor L when the overcurrent occurs, and further flow of overcurrent in the DUT 2 is prevented in the P-side switching measurement.

When faster breaking of the overcurrent is required in the N-side switching measurement, the interceptor 26 may also instruct the driving driver 16 to operate the high-speed breaking circuit 43 in addition to the overcurrent preventing circuit 42 in response to the detection of the overcurrent in the N output terminal Tn. More specifically, the interceptor 26 may instruct the driving driver 16 to put the transistors Qir and Qdn into the on-state and put the other transistors into the off-state. In this case, only the current path is formed which goes round through the reactor L, the transistor Qir, and the diode Dif in this order. In this way, the energy stored in the reactor L when the overcurrent occurs flows in the current path. In the current path, the energy is consumed by the resistance components and the like, such as transistors and diodes, and the amount of current becomes 0. In this way, the overcurrent preventing circuit 42 consumes the energy stored in the reactor L when the overcurrent occurs, and further flow of overcurrent in the DUT 2 is prevented in the N-side switching measurement.

Similarly, when faster breaking of the overcurrent is required in the P-side switching measurement, the interceptor 26 may instruct the driving driver 16 to operate the high-speed breaking circuit 43 in addition to the overcurrent preventing circuit 42 in response to the detection of the overcurrent in the P output terminal Tp. More specifically, the interceptor 26 may instruct the driving driver 16 to put the transistors Qif and Qdp into the on-state and put the other transistors into the off-state. In this case, only the current path is formed which goes round through the reactor L, the transistor Qif, and the diode Dir in this order. In this way, the energy stored in the reactor L when the overcurrent occurs flows in the current path. In the current path, the energy is consumed by the resistance components and the like, such as transistors and diodes, and the amount of current becomes 0. In this way, the overcurrent preventing circuit 42 consumes the energy stored in the reactor L when the overcurrent occurs, and further flow of overcurrent in the DUT 2 is prevented in the P-side switching measurement.

Note that compared to when the high-speed breaking circuit 43 is not operated, the resistance value contributing to the consumption of the overcurrent is large when the high-speed breaking circuit 43 is operated. Therefore, the energy stored in the reactor L is consumed in a short time. Therefore, further flow of overcurrent in the DUT 2 is more surely prevented in the switching measurement.

Next, a specific configuration of the replacement unit 24 will be described with reference to FIGS. 6 to 10. FIG. 6 is a schematic configuration diagram of the replacement unit 24. FIG. 7 is a schematic configuration diagram of a motherboard for voltage included in the replacement unit 24. FIG. 8 is a schematic configuration diagram of a motherboard for current included in the replacement unit 24. FIG. 9 is a schematic configuration diagram of specific units that can be attached to and detached from the replacement unit 24, wherein (a) of FIG. 9 is a plan view of the specific units, and (b) of FIG. 9 is a side view of the specific units. FIG. 10 is a diagram for describing connection of the motherboard of FIG. 8 and the specific units of FIG. 9.

As shown in FIG. 6, the replacement unit 24 includes a motherboard MB1 and a motherboard MB2. The motherboard MB1 is a motherboard for voltage. The motherboard MB2 is a motherboard for current. The motherboard MB1 and the motherboard MB2 extend in a direction X and are arranged parallel to each other in a direction Y intersecting with the direction X. The high voltage units 71, the low voltage units 72, and an intermediate voltage unit 74 can be attached to and detached from the motherboard MB1. The intermediate voltage unit 74 is a unit for supplying a voltage of about 1500V to the high voltage units 71 and supplying a voltage of about 150V to the low voltage units 72. The intermediate voltage unit 74 is not a unit directly related to the measurement and is used in subordination to the high voltage units 71 and the low voltage units 72.

The large-current source unit 73 can be attached to and detached from the motherboard MB2. The large-current source unit 73 includes one large-current master 75 and a plurality of large-current boosters 76 (a plurality of current source subunits). The large-current master 75 is configured to control measurement of the DUT 2 requiring the large-current source unit 73. The large-current master 75 can supply a current of, for example, about 1 A. The large-current boosters 76 are appropriately used according to the amount of current necessary for the measurement and can supply a current of a first amount of current. The first amount of current is, for example, about 125 A. The large-current master 75 transmits a current instruction to each large-current booster 76 at, for example, a timing designated by the integrated controller 31. Each large-current booster 76 receives the current instruction transmitted from the large-current master 75 and supplies a current according to the current instruction. The large-current master 75 also measures the voltage and the current at a timing designated by the integrated controller 31.

When the measurement item is a measurement item that requires the large-current source unit 73, one large-current master 75 and one large-current booster 76 are always mounted on the replacement unit 24. A necessary number of (for example, one to four) large current boosters 76 among the plurality of large-current boosters 76 are mounted on the replacement unit 24 according to the amount of current necessary for the measurement. Note that when the amount of current necessary for the measurement exceeds the amount of current that can be supplied by one large-current master 75 and four large-current boosters 76 (about 500 A in this example), another motherboard MB2 may be further added to the replacement unit 24. By mounting a necessary number of large-current boosters 76 on the added motherboard MB2, the large-current source unit 73 can supply the amount of current necessary for the measurement.

As shown in FIG. 7, the motherboard MB1 includes: a connector CN1 electrically connected to the power supply of the second apparatus 20; a plurality of connectors CN2 electrically connected to the static characteristic measurement circuit 21; and a plurality of connectors CN3 for electrical connection with each specific unit. The connector CN1, the connectors CN2, and the connectors CN3 are provided on a surface MB1a on one side of the motherboard MB1. The connector CN1 and the connectors CN2 are arranged in the direction Y at one end of the motherboard MB1 in the direction X. A power supply voltage for control is supplied to the high voltage units 71, the low voltage units 72, and the intermediate voltage unit 74 mounted on the motherboard MB1 through the connector CN1. The high voltage units 71 and the low voltage units 72 mounted on the motherboard MB1 are electrically connected to the static characteristic measurement circuit 21 through the connectors CN2. The connectors CN3 for connection with each specific unit and guide mechanisms G (see FIG. 10) form slots. Specifically, the motherboard MB1 includes slots SL1 to SL5 that allow attaching and detaching the specific units. The slots SL1 to SL5 are sequentially arranged in the direction X. The slots SL1 and SL2 are slots for the high voltage units 71. The slot SL3 is a slot for the intermediate voltage unit 74. The slots SL4 and SL5 are slots for the low voltage units 72.

The connectors CN3 include connectors CN31, connectors CN32, connectors CN33, connectors CN34, and connectors CN35. The connectors CN31 are connectors for supplying each specific unit with the power supply voltage supplied through the connector CN1. The connectors CN32 are connectors for supplying the voltage from the intermediate voltage unit 74 to the high voltage units 71. The connectors CN33 are connectors for supplying the voltage from the intermediate voltage unit 74 to the low voltage units 72. The connectors CN34 are connectors for electrically connecting the static characteristic measurement circuit 21 and the high voltage units 71 through the connectors CN2. The connectors CN35 are connectors for electrically connecting the static characteristic measurement circuit 21 and the low voltage units 72 through the connectors CN2. The slots SL1 and SL2 are formed by the connectors CN31, CN32, and CN34, the slot SL3 is formed by the connectors CN31, CN32, and CN33, and the slots SL4 and SL5 are formed by the connectors CN31, CN33, and CN35.

As shown in FIG. 8, the motherboard MB2 includes: a connector CN4 electrically connected to the power supply of the second apparatus 20; a connector CN5 electrically connected to the static characteristic measurement circuit 21; and a plurality of connectors CN6 for connecting each specific unit. The connector CN4, the connector CN5, and the connectors CN6 are provided on a surface MB2a on one side of the motherboard MB2. The connector CN4 and the connector CN5 are arranged in the direction Y at one end of the motherboard MB2 in the direction X. The power supply voltage for control is supplied to the large-current master 75 and the large-current boosters 76 mounted on the motherboard MB2 through the connector CN4. The large-current master 75 and the large-current boosters 76 mounted on the motherboard MB2 are electrically connected to the large-current measurement circuit 23 through the connector CN5. The connectors CN6 for connecting each specific unit and the guide mechanisms G (see FIG. 10) form slots. Specifically, the motherboard MB2 includes slots SL6 to SL10 that allow attaching and detaching the specific units. The slots SL6 to SL10 are sequentially arranged in the direction X. The slot SL6 is a slot for the large-current master 75. The slots SL7 to SL10 are slots for the large-current boosters 76.

The connectors CN6 include a connector CN61, a connector CN62, connectors CN63, connectors CN64, and connectors CN65. The connector CN61 is a connector for supplying the large-current master 75 with the power supply voltage supplied through the connector CN4. The connector CN62 is a connector for electrically connecting the large-current measurement circuit 23 and the large-current master 75 through the connector CN5. The connectors CN63 are connectors for supplying the large-current boosters 76 with the power supply voltage supplied through the connector CN4 and for electrically connecting the large-current measurement circuit 23 and the large-current boosters 76 through the connector CN5. The connectors CN64 and the connectors CN65 are connectors for the current output from the large-current boosters 76. The connectors CN64 are + output connectors, and the connectors CN65 are − output connectors. The slot SL6 is formed by the connectors CN61 and CN62, and the slots SL7 to 10 are formed by the connectors CN63, CN64, and CN65. Note that on a surface on the opposite side of the surface MB2a on one side, the motherboard MB2 includes a connector not shown connected to an external low voltage power supply.

The high voltage units 71, the low voltage units 72, the intermediate voltage unit 74, the large-current master 75, and the large-current boosters 76 all have similar configurations. Here, an example of the large-current master 75 will be used to describe the configuration of the specific units and the connection of the specific units and the motherboards with reference to FIGS. 9 and 10. As shown in FIG. 9, the large-current master 75 includes a control substrate 81, a power substrate 82, a connector 83, a connector 84, and connectors 85. The control substrate 81 is a substrate for controlling the power substrate 82 to obtain desirable voltage and current. Note that on an end portion of the control substrate 81 on the opposite side of the motherboard MB2, the control substrate 81 includes a connector (for example, a LAN connector) for connection and communication with the integrated controller 31 and a connector (for example, a connector for optical communication) for connection and communication with the trigger matrix 25. The control substrate 81 is commonly used by the high voltage units 71, the low voltage units 72, the intermediate voltage unit 74, the large-current master 75, and the large-current boosters 76. The power substrate 82 varies for each of the high voltage units 71, the low voltage units 72, the intermediate voltage unit 74, the large-current master 75, and the large-current boosters 76. The power substrate 82 of the high voltage units 71 and the low voltage units 72 performs power conversion for converting the constant voltage generated by the intermediate voltage unit 74 to desirable voltage and current. The power substrate 82 of the large-current source unit 73 performs power conversion for converting the power supply voltage of the second apparatus 20 to desirable voltage and current.

The connector 83 is a connector for connecting the large-current master 75 to the connector CN61 of the motherboard MB2. The connector 84 is a connector for connecting the large-current master 75 to the connector CN62 of the motherboard MB2. The connector 83 and the connector 84 are provided on one end 82a of the power substrate 82 and are arranged along an edge of the one end 82a of the power substrate 82. The connectors 85 are connectors for electrically connecting the control substrate 81 and the power substrate 82. A main surface on one side of the control substrate 81 and a main surface on one side of the power substrate 82 face each other through the connector 85, and the control substrate 81 and the power substrate 82 are arranged in such a way that the control substrate 81 and the power substrate 82 overlap.

As shown in FIG. 10, the replacement unit 24 includes the guide mechanisms G. The guide mechanisms G are a pair of members extending in a direction Z intersecting with the surface MB2a on one side of the motherboard MB2. The guide mechanisms G hold both ends of the power substrate 82 of the large-current master 75 in the extending direction in such a way that the both ends can slide. Work of mounting the large-current master 75 on the motherboard MB2 is performed by inserting the large-current master 75 into the slot SL6 along the guide mechanisms G. In this case, the large-current master 75 is inserted into the slot SL6 in a state that the one end 82a of the power substrate 82 faces the surface MB2a on one side of the motherboard MB2. The large-current master 75 is inserted along the guide mechanisms G until the connector 83 and the connector 84 are fitted to the connector CN61 and the connector CN62 of the motherboard MB2, respectively. On the other hand, work of removing the large-current master 75 from the motherboard MB2 is performed by pulling out the large-current master 75 from the slot SL6 along the guide mechanisms G.

FIG. 11 is a diagram showing the units used for each measurement. FIG. 11 illustrates part of the static characteristic test and the dynamic characteristic test that can be conducted by the power semiconductor test system 1. As shown in FIG. 11, the integrated controller 31 and the trigger matrix 25 are used for all measurements. In each measurement of the dynamic characteristic test, the test head 12, the dynamic characteristic measurement circuit 14, the capacitor bank 15, the driving driver 16, the current sensors 17, the voltage sensors 18, the interceptor 26, the digitizer 27, the charge power supply 32, and the dynamic characteristic controller 33 are used in addition to the integrated controller 31 and the trigger matrix 25. The large-current measurement circuit 23 is further used for the measurement of the emitter-collector voltage Vec.

On the other hand, the units used for each measurement vary in the static characteristic test. For example, the static characteristic measurement circuit 21 and the high voltage units 71 are used in addition to the integrated controller 31 and the trigger matrix 25 for the measurement of the collector breaking current Ices. For the measurement of the gate-emitter threshold voltage Vge (th), the static characteristic measurement circuit 21, the gate servo 22, the low voltage units 72, and the large-current source unit 73 are used in addition to the integrated controller 31 and the trigger matrix 25. For the measurement of the gate-emitter leakage current Iges, the static characteristic measurement circuit 21 and the low voltage units 72 are used in addition to the integrated controller 31 and the trigger matrix 25. For the measurement of the collector-emitter saturation voltage Vce (sat), the static characteristic measurement circuit 21, the large-current measurement circuit 23, the low voltage units 72, and the large-current source unit 73 are used in addition to the integrated controller 31 and the trigger matrix 25.

In the power semiconductor test system 1, the specific units (the high voltage units 71, the low voltage units 72, and the large-current source unit 73) selectively used according to the measurement item of the static characteristic test can be attached to and detached from the replacement unit 24. Therefore, necessary specific units can be mounted on the replacement unit 24, and unnecessary specific units can be removed from the replacement unit 24 according to the requested measurement item of the static characteristic test. The gate servo 22 can be attached to and detached from the static characteristic measurement circuit 21. Therefore, the gate servo 22 is mounted on the static characteristic measurement circuit 21, or the gate servo 22 is removed from the static characteristic measurement circuit 21 according to the requested measurement item of the static characteristic test. As a result, even when the test item (measurement item) requested by each user varies, the power semiconductor test system 1 does not have to be separately designed, and the power semiconductor test system 1 that can handle requested specifications by simple work of just attaching and detaching the specific units and the gate servo 22 can be provided.

Furthermore, the magnitude of necessary current may vary according to the measurement item of the static characteristic test and the requested specifications of the user. When the measurement item is a measurement item requiring the large-current source unit 73, one large-current master 75 and one large-current booster 76 are mounted on the replacement unit 24. When the first amount of current that can be supplied by the one large-current booster 76 is smaller than the amount of current necessary for the measurement, a necessary number of large-current boosters 76 are further mounted on the replacement unit 24. In this way, the large-current source unit 73 does not have to be separately designed according to the amount of current necessary for the requested measurement, and the power semiconductor test system 1 that can handle the requested specifications by simple work of just mounting the necessary number of large-current boosters 76 can be provided.

Furthermore, the magnitude of necessary voltage may vary according to the measurement item of the static characteristic test and the requested specifications of the user. When the measurement item is a measurement item requiring the high voltage units 71, a necessary number of high voltage units 71 are mounted on the replacement unit 24 according to the voltage value necessary for the measurement. Similarly, when the measurement item is a measurement item requiring the low voltage units 72, a necessary number of low voltage units 72 are mounted on the replacement unit 24 according to the voltage value necessary for the measurement. In this way, the high voltage units 71 and the low voltage units 72 do not have to be separately designed according to the voltage value necessary for the requested measurement, and the power semiconductor test system 1 that can handle the requested specifications by simple work of just mounting the necessary numbers of high voltage units 71 and low voltage units 72 can be provided.

In this way, necessary units are mounted on the replacement unit 24, and unnecessary units are removed from the replacement unit 24 according to the requested specifications. In this case, the unit definition file is added and deleted in the integrated controller 31 according to the units attached to and detached from the replacement unit 24. The integrated controller 31 detects a system configuration error when the unit designated by the unit definition file does not exist in the IP address included in the unit definition file. In this way, the integrated controller 31 can recognize the unit mounted on the replacement unit 24. Note that in the large-current source unit 73, the IP address may be allocated to the large-current master 75, and the IP address may not be allocated to the large-current boosters 76. That is, one IP address may be allocated for the entire large-current source unit 73.

Each unit of the plurality of static characteristic units and the plurality of dynamic characteristic units is arranged at a position closer to the DUT 2 when the degree of influence, on the measurement accuracy of the DUT 2, of the signal transmitted and received by the unit is larger. In this case, the unit that transmits and receives a signal with a large degree of influence on the measurement accuracy of the DUT 2 is arranged close to the DUT 2, and the length of the wiring between the unit and the DUT 2 can be short. In other words, each unit is arranged in such a way that the larger the degree of influence, the shorter the length of the wiring between the unit and the DUT 2. Therefore, inductance components of the wiring for transmitting a signal with a large degree of influence on the measurement accuracy of the DUT 2 can be reduced, and the measurement accuracy of the DUT 2 can be improved.

In the power semiconductor test system 1 of the embodiments, the units of the plurality of static characteristic units and the plurality of dynamic characteristic units are distributed to the first apparatus 10, the second apparatus 20, and the third apparatus 30 according to the management level Lv. That is, each unit is housed in one of the housing 19, the housing 28, and the housings 34. The distance from the DUT 2 (wiring length from the DUT 2) is, for example, about 10 to 100 mm for the units of the management level Lv1, the distance from the DUT 2 (wiring length from the DUT 2) is, for example, about 10 to 100 cm for the units of the management level Lv2, and the distance from the DUT 2 (wiring length from the DUT 2) is, for example, about 10 to 100 m for the units of the management level Lv3. Therefore, the first apparatus 10, the second apparatus 20, and the third apparatus 30 are arranged in such a way that the distance from the DUT 2 increases in order of the first apparatus 10, the second apparatus 20, and the third apparatus 30. In other words, the second apparatus 20 is arranged at a position farther from the DUT 2 than the first apparatus 10. The third apparatus 30 is arranged at a position farther from the DUT 2 than the second apparatus 20. Therefore, the housing 19, the housing 28, and the housings 34 are arranged in such a way that the distance from the DUT 2 increases in order of the housing 19, the housing 28, and the housings 34.

For example, when all of the units are housed in the housing 19 arranged near the DUT 2, the housing 19 is enlarged, and the arrangement in using the power semiconductor test system 1 is limited. On the other hand, each unit can be distributed and housed in the housing 19, the housing 28, and the housings 34 according to the degrees of influence, on the measurement accuracy of the DUT 2, of the signals transmitted and received by the unit to thereby downsize the housing 19 arranged near the DUT 2 while suppressing the reduction in the measurement accuracy of the DUT 2.

For example, as shown in FIG. 12, the housing 19 (first apparatus 10) can be arranged between a pair of conveyors 3 for conveying the DUT 2, the housing 28 (second apparatus 20) can be arranged near a conveyance line formed by the pair of conveyors 3 and the first apparatus 10, and the housings 34 (third apparatus 30) can be arranged at a position away from the conveyance line. In this way, by arranging the downsized first apparatus 10 on the conveyance line of the DUT 2, it becomes possible to shorten the movement distance of the DUT 2 in the supply of the DUT 2 from the conveyor 3 positioned on the upstream of the conveyance line to the power semiconductor test system 1 and in the ejection of the DUT 2 from the power semiconductor test system 1 to the conveyor 3 positioned on the downstream of the conveyance line. That is, if the first apparatus 10 is enlarged, the conveyance interval of the DUT 2 needs to be increased, and the conveyance line becomes large. However, the conveyance interval of the DUT 2 can be reduced by downsizing the first apparatus 10, and the conveyance line can be downsized. Therefore, it is unnecessary to provide a robot for transfer or the like in order to prevent the enlargement of the conveyance line. As a result, the test of the DUT 2 can be efficient. In this way, the degree of freedom of the arrangement in using the power semiconductor test system 1 can be improved.

Furthermore, by arranging the interceptor 26 near the current sensors 17 and the voltage sensors 18, the wiring between the current sensors 17 and the interceptor 26 and between the voltage sensors 18 and the interceptor 26 can be short, and the detection accuracy of an abnormal state can be improved. Since the dynamic characteristic controller 33 and the driving driver 16 are connected by an optical signal through the interceptor 26, high speed control is possible even if the dynamic characteristic controller 33 is arranged farther from the driving driver 16 than the interceptor 26. Furthermore, by arranging the digitizer 27 near the current sensors 17 and the voltage sensors 18, the wiring between the current sensors 17 and the digitizer 27 and between the voltage sensors 18 and the digitizer 27 can be short, and the measurement accuracy can be improved.

The plurality of static characteristic units (the static characteristic measurement circuit 21, the gate servo 22, the large-current measurement circuit 23, the trigger matrix 25, the high voltage units 71, the low voltage units 72, and the large-current source unit 73) are housed in the housing 28. Since the static characteristic test is less likely to be affected by the inductance components compared to the dynamic characteristic test, the static characteristic units can be arranged at positions somewhat away from the DUT 2. In this way, the number of units housed in the housing 19 can be decreased. As a result, the housing 19 can be downsized without reducing the measurement accuracy of the DUT 2.

By using the DIB 11 according to the type of the DUT 2 to be tested, it is unnecessary to design the power semiconductor test system 1 for each of the different types of DUTs 2. That is, the part of the power semiconductor test system 1 except the DIB 11 can be shared regardless of the type of the DUT 2.

Note that the power semiconductor test system according to the present invention is not limited to the embodiments. For example, the semiconductor elements included in the DUT 2 are not limited to the IGBTs. The semiconductor elements included in the DUT 2 may be field effect transistors (FETs), diodes, or the like. Even in such a DUT 2, since the number and the arrangement of the probes 62 of the DIB 11 are appropriately designed according to the terminals of the DUT 2, the design of the power semiconductor test system 1 does not have to be changed except for the DIB 11.

The design of the static characteristic measurement circuit 21 may be changed according to the measurement item of the static characteristic test included in the requested specifications. Since the large-current measurement circuit 23 needs to select the measurement target included in the DUT 2, the circuit configuration of the large-current measurement circuit 23 may be changed according to the number of elements to be measured included in the DUT 2 or the like when the difference in the number of elements to be measured included in the DUT 2 and the like according to the type of the DUT 2 cannot be absorbed by the DIB 11. According to the configuration mentioned above, the customer's need can be met by appropriately changing the specific units mounted on the replacement unit 24 when supplying the test system to the customer, and by changing the design of the static characteristic measurement circuit 21 and the large-current measurement circuit 23. In other words, the customer's need can be met by mainly changing the second apparatus 20. Parts other than the second apparatus 20 can be dealt with by making minor adjustments to the software of the integrated controller 31 or the like, for example. In this way, the test system can be quickly supplied to customers with various requests, and the cost can be reduced.

The units mounted on the replacement unit 24 may be recognized by Plug and Play. In this case, the integrated controller 31 may detect the system configuration error when the units recognized by the system definition file and the units recognized by Plug and Play are different.

The P output terminal Tp and the N output terminal Tn may be parallel. For example, as shown in FIG. 13, each of the P output terminal Tp and the N output terminal Tn includes a cylinder portion 91 and a flat plate portion 92. The cylinder portion 91 is a metallic bus bar and is inserted into the annular current sensor 17. An outside diameter of the cylinder portion 91 is the same as an inside diameter of the current sensor 17 or is slightly smaller than the inside diameter of the current sensor 17. Such a shape improves the current measurement accuracy while reducing the current density. The cylinder portion 91 includes an end portion 91a and an end portion 91b. The end portion 91a is positioned at one end of the cylinder portion 91 and is semi-cylindrical. A surface 91c of the end portion 91a along an axial center of the cylinder portion 91 is in contact with a surface on one side of a substrate 53 of the capacitor bank 15. The surface 91c of the P output terminal. Tp is in contact with a surface 53a of the substrate 53. The surface 91c of the N output terminal Tn is in contact with a surface 53b that is a surface opposite the surface 53a of the substrate 53.

The end portion 91b is positioned at the other end of the cylinder portion 91. The flat plate portion 92 is electrically connected to the end portion 91b. The flat plate portion 92 of the P output terminal Tp and the flat plate portion 92 of the N output terminal Tn are constituted as parallel flat plates formed by flat braided conductors across an insulator. The insulator is, for example, insulating paper or an insulating heat-shrinkable tube. In this case, since the flat plate portion 92 of the P output terminal Tp and the flat plate portion 92 of the N output terminal Tn are parallel, and currents in opposite directions flow in the flat plate portion 92 of the P output terminal Tp and the flat plate portion 92 of the N output terminal Tn, the inductance of the P output terminal Tp and the N output terminal Tn can be reduced. As a result, the measurement accuracy of the dynamic characteristic test can be improved. Furthermore, flexibility of the flat plate portions 92 can also be realized.

Furthermore, the connection pattern of the P output terminal Tp and the capacitor bank 15 and the connection pattern of the N output terminal Tn and the capacitor bank 15 may be parallel. FIG. 14 is a diagram schematically showing an example of the capacitor bank 15, wherein (a) of FIG. 14 is a cross-sectional view of the capacitor bank 15, and (b) of FIG. 14 is an end view along a line XIVb-XIVb of (a) of FIG. 14. As shown in FIG. 14, the capacitor bank 15 includes a plurality of capacitors 51, the main switch portion 52, and the substrate 53. The substrate 53 is a multi-layer printed circuit board. In the example shown in FIG. 14, the substrate 53 is a four-layer printed circuit board. The substrate 53 includes the surface 53a and the surface 53b that is a surface on the opposite side of the surface 53a. The substrate 53 includes a base 54 that is a plate-like insulator and includes a first layer 55, a second layer 56, a third layer 57, and a fourth layer 58 as wiring layers. The first layer 55, the second layer 56, the third layer 57, and the fourth layer 58 are constituted by a conductive material such as copper foil. A wiring pattern is formed on each of the first layer 55, the second layer 56, the third layer 57, and the fourth layer 58.

The base 54 includes a surface 54a and a surface 54b that is a surface on the opposite side of the surface 54a. The first layer 55 is provided on the surface 54a. The second layer 56 and the third layer 57 are provided inside of the base 54. The + terminals of the capacitor 51, the main switch portion 52, and the P output terminal Tp are electrically connected to the second layer 56, and the wiring of the second layer 56 forms P output wiring. The − terminals of the capacitors 51 and the N output terminal Tn are electrically connected to the third layer 57, and the wiring of the third layer 57 forms N output wiring. The fourth layer 58 is provided on the surface 54b. The surface 53a is equivalent to the surface 54a provided with the first layer 55, and the surface 53b is equivalent to the surface 54b provided with the fourth layer 58.

At the end portion 53c of the substrate 53, the end portion 91a of the P output terminal Tp and the end portion 91a of the N output terminal Tn are arranged in such a way as to sandwich the substrate 53. The first layer 55 has a connection pattern 55a for electrically connecting the end portion 91a of the P output terminal Tp at the end portion 53c. The fourth layer 58 has a connection pattern 58a for electrically connecting the end portion 91a of the N output terminal Tn at the end portion 53c. The connection pattern 55a and the connection pattern 58a are arranged in parallel.

IVHs (Interstitial Via Holes) 59 are provided on the base 54. The IVHs 59 are structures for electrically connecting the layers of the substrate 53 by providing a conductive material on wall surfaces of holes not penetrating through the base 54. The IVHs 59 include IVHs 59a and IVHs 59b. The IVHs 59a extend from the surface 54a toward the inside of the base 54 and electrically connect the connection pattern 55a of the first layer 55 and the second layer 56. The IVHs 59b extend from the surface 54b toward the inside of the base 54 and electrically connect the third layer 57 and the connection pattern 58a of the fourth layer 58.

As shown in FIG. 15, when normal through hole vias 159 are used instead of the IVHs, holes penetrating through the base 54 are provided on the end portion 53c. Since the potential difference is large around the through hole vias 159, the wiring pattern needs to be provided at an insulation interval from the through hole vias 159. Therefore, since the wiring pattern cannot be provided around the through hole vias 159, the connection pattern 55a and the connection pattern 58a cannot be sufficiently parallel at the end portion 53c of the substrate 53, and the inductance increases accordingly.

In this way, the connection pattern 55a and the connection pattern 58a can be arranged in parallel at the end portion 53c of the substrate 53 by using the IVHs 59. Therefore, the inductance of the P output wiring including the connection pattern 55a and the N output wiring including the connection pattern 58a can be further reduced. As a result, the measurement accuracy of the dynamic characteristic test can be further improved.

The thickness of the second layer 56 and the third layer 57 may be larger than the thickness of the first layer 55 and the fourth layer 58. In this case, the current flowing through the second layer 56 and the third layer 57 can be increased. The interval between the second layer 56 and the third layer 57 may be smaller than the interval between the first layer 55 and the second layer 56 and the interval between the third layer 57 and the fourth layer 58. In this case, the inductance of the P output wiring and the N output wiring can be further reduced, and the measurement accuracy of the dynamic characteristic test can be further improved.

REFERENCE SIGNS LIST

1 . . . power semiconductor test system (test system), 2 . . . DUT (device under test), 10 . . . first apparatus, 11 . . . DIB (interface substrate), 12 . . . test head, 14 . . . dynamic characteristic measurement circuit (dynamic characteristic unit), 15 . . . capacitor bank (dynamic characteristic unit), 16 . . . driving driver (dynamic characteristic unit), 17 . . . current sensor (dynamic characteristic unit), 18 . . . voltage sensor (dynamic characteristic unit), 19 . . . housing (first housing), 20 . . . second apparatus, 21 . . . static characteristic measurement circuit (static characteristic unit), 22 . . . gate servo (static characteristic unit), 23 . . . large-current measurement circuit (static characteristic unit), 24 . . . replacement unit (static characteristic unit), 25 . . . trigger matrix, 28 . . . housing (second housing), 26 . . . interceptor (dynamic characteristic unit), 27 . . . digitizer (dynamic characteristic unit), 30 . . . third apparatus, 31 . . . integrated controller, 32 . . . charge power supply (dynamic characteristic unit), 33 . . . dynamic characteristic controller (dynamic characteristic unit), 34, 34a, 34b . . . housing (third housing), 62, 62p, 62n, 62o, 62g . . . probes, 71 . . . high voltage unit (static characteristic unit, specific unit, first voltage unit), 72 . . . low voltage unit (static characteristic unit, specific unit, second voltage unit), 73 . . . large-current source unit (static characteristic unit, specific unit, current source unit), 75 . . . large-current master, 76 . . . large-current booster (current source subunit).

The invention claimed is:

1. A test system for conducting a test of a device under test, the test system comprising:
a plurality of static characteristic units used for measurement of a static characteristic test of the device under test;
a replacement unit configured to be able to attach and detach specific units among the plurality of static characteristic units, the specific units selectively used according to a measurement item of the static characteristic test; and
a plurality of dynamic characteristic units for performing a dynamic characteristic test of the device under test, wherein
the plurality of dynamic characteristic units comprise:
a dynamic characteristic measurement circuit for performing the dynamic characteristic test;
a dynamic characteristic controller configured to control the dynamic characteristic measurement circuit and the device under test according to a preset measurement pattern of the dynamic characteristic test; and
an interceptor configured to control the dynamic characteristic measurement circuit and the device under test when an abnormal state is detected in the dynamic characteristic test;
the dynamic characteristic measurement circuit comprises an overcurrent preventing circuit,
the interceptor operates the overcurrent preventing circuit in response to the interceptor detecting flow of overcurrent in the device under test, and
the interceptor is arranged at a position closer to the device under test than the dynamic characteristic controller.

2. The test system according to claim 1, wherein the specific units include:
a first voltage unit configured to apply a first voltage to the device under test;
a second voltage unit configured to apply a second voltage smaller than the first voltage to the device under test; and
a current source unit configured to supply a current to the device under test, and
the first voltage unit, the second voltage unit, and the current source unit are mounted on the replacement unit according to a requested measurement item.

3. The test system according to claim 2, wherein the current source unit includes a plurality of current source subunits configured to supply a current of a first amount of current to the device under test, and when the measurement item is a measurement item requiring the current source unit, a necessary number of current source subunits among the plurality of current source subunits are mounted on the replacement unit according to an amount of current necessary for the measurement item.

4. The test system according to claim 1, wherein each unit of the plurality of static characteristic units and the plurality of dynamic characteristic units is arranged at a position closer to the device under test when a degree of influence, on a measurement accuracy of the device under test, of a signal transmitted and received by the unit is larger.

5. The test system according to claim 4, further comprising a first housing, a second housing, and a third housing, wherein the first housing, the second housing, and the third housing are arranged in such a way that a distance from the device under test increases in order of the first housing, the second housing, and the third housing, and the each unit is housed in one of the first housing, the second housing, and the third housing according to the degree of influence.

6. The test system according to claim 5, wherein the plurality of static characteristic units are housed in the second housing.

7. The test system according to claim 1, further comprising an interface substrate for absorbing a physical difference according to a type of the device under test, wherein the interface substrate comprises probes electrically connected to electrodes of the device under test, and the number and arrangement of the probes are set according to the type of the device under test.

8. The test system according to claim 1, wherein the device under test is a power semiconductor module.

9. The test system according to claim 2, wherein each unit of the plurality of static characteristic units and the plurality of dynamic characteristic units is arranged at a position closer to the device under test when a degree of influence, on a measurement accuracy of the device under test, of a signal transmitted and received by the unit is larger.

10. The test system according to claim 3, wherein each unit of the plurality of static characteristic units and the plurality of dynamic characteristic units is arranged at a position closer to the device under test when a degree of influence, on a measurement accuracy of the device under test, of a signal transmitted and received by the unit is larger.

11. The test system according to claim 9, further comprising a first housing, a second housing, and a third housing, wherein the first housing, the second housing, and the third housing are arranged in such a way that a distance from the device under test increases in order of the first housing, the second housing, and the third housing, and the each unit is housed in one of the first housing, the second housing, and the third housing according to the degree of influence.

12. The test system according to claim 10, further comprising a first housing, a second housing, and a third housing, wherein the first housing, the second housing, and the third housing are arranged in such a way that a distance from the device under test increases in order of the first housing, the second housing, and the third housing, and the each unit is housed in one of the first housing, the second housing, and the third housing according to the degree of influence.

13. The test system according to claim 11, wherein the plurality of static characteristic units are housed in the second housing.

14. The test system according to claim 12, wherein the plurality of static characteristic units are housed in the second housing.

15. A test system for conducting a test including a static characteristic test of a device under test, the test system comprising:

a plurality of static characteristic units used for measurement of the static characteristic test; and a replacement unit configured to be able to attach and detach specific units among the plurality of static characteristic units, the specific units selectively used according to a measurement item of the static characteristic test, wherein the specific units include:

a first voltage unit configured to apply a first voltage to the device under test;

a second voltage unit configured to apply a second voltage smaller than the first voltage to the device under test; and a current source unit configured to supply a current to the device under test, and the first voltage unit, the second voltage unit, and the current source unit are mounted on the replacement unit according to a requested measurement item.

\* \* \* \* \*